United States Patent
Chuang

(10) Patent No.: US 12,193,211 B2
(45) Date of Patent: Jan. 7, 2025

(54) METHOD OF MANUFACTURING SEMICONDUCTOR DEVICE WITH WORD LINES

(71) Applicant: NANYA TECHNOLOGY CORPORATION, New Taipei (TW)

(72) Inventor: Ying-Cheng Chuang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 469 days.

(21) Appl. No.: 17/831,593

(22) Filed: Jun. 3, 2022

(65) Prior Publication Data

US 2023/0397389 A1   Dec. 7, 2023

(51) Int. Cl.
   *H01L 27/108* (2006.01)
   *H01L 29/66* (2006.01)
   *H01L 29/786* (2006.01)
   *H10B 12/00* (2023.01)

(52) U.S. Cl.
   CPC ....... *H10B 12/05* (2023.02); *H01L 29/66742* (2013.01); *H01L 29/78642* (2013.01); *H10B 12/036* (2023.02); *H10B 12/33* (2023.02)

(58) Field of Classification Search
   None
   See application file for complete search history.

(56) References Cited

U.S. PATENT DOCUMENTS

2023/0133520 A1 *   5/2023   Zhao .................... H10B 12/488
                                                            257/295

FOREIGN PATENT DOCUMENTS

TW    201220459 A    5/2012
TW    201220475 A    5/2012

OTHER PUBLICATIONS

Office Action mailed on Mar. 13, 2023 related to Taiwanese Application No. 111129841.

* cited by examiner

*Primary Examiner* — Asok K Sarkar
(74) *Attorney, Agent, or Firm* — Xuan Zhang

(57) ABSTRACT

A method of manufacturing a semiconductor device is provided. The method includes: providing a substrate; forming a metallization layer on the substrate; forming an upper dielectric layer over the metallization layer; forming a first sacrificial layer and a second sacrificial layer, each of which penetrates the upper dielectric layer and the metallization layer; removing the upper dielectric layer; forming a width controlling structure between the first sacrificial layer and the second sacrificial layer, wherein the width controlling structure defines a recess exposing the metallization layer; forming a protective layer within the recess of the width controlling structure; removing the width controlling structure to expose a portion of the metallization layer; and patterning the metallization layer to form a word line between the first sacrificial layer and the second sacrificial layer.

10 Claims, 39 Drawing Sheets

METHOD OF MANUFACTURING SEMICONDUCTOR DEVICE WITH WORD LINES

TECHNICAL FIELD

The present disclosure relates to a method of manufacturing a semiconductor device, and in particularly to a method using a width controlling structure to determine the width of a word line.

DISCUSSION OF THE BACKGROUND

With the rapid growth of the electronics industry, the development of integrated circuits (ICs) has achieved high performance and miniaturization. Technological advances in IC materials and design have produced generations of ICs where each generation has smaller and more complex circuits than the previous generation.

A Dynamic Random Access Memory (DRAM) device is a type of random access memory that stores each bit of data in a separate capacitor within an integrated circuit. Typically, a DRAM is arranged in a square array of one capacitor and transistor per cell. A vertical transistor has been developed for the 4F 2 DRAM cell, in which F represents the photolithographic minimum feature width or critical dimension (CD). However, recently, DRAM manufacturers are facing significant challenges in minimizing memory cell area as word line spacing continues to be reduced. For example, the channel of a bit line is prone to contact with a word line, thereby inducing electrical short due to an overlay error in lithography process.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a method of manufacturing a semiconductor device. The method includes providing a substrate comprising a first capacitor structure and a second capacitor structure thereon, forming a metallization layer on the substrate, forming an upper dielectric layer over the metallization layer, forming a first sacrificial layer and a second sacrificial layer, each of which penetrates the upper dielectric layer and the metallization layer, wherein the first sacrificial layer vertically overlaps the first capacitor structure and the second sacrificial layer vertically overlaps the second capacitor structure, removing the upper dielectric layer, forming a width controlling structure between the first sacrificial layer and the second sacrificial layer, wherein the width controlling structure defines a recess exposing the metallization layer, forming a protective layer within the recess of the width controlling structure, removing the width controlling structure to expose a portion of the metallization layer, and patterning the metallization layer to form a word line between the first sacrificial layer and the second sacrificial layer.

Another aspect of the present disclosure provides a method of manufacturing a semiconductor device. The method includes providing a substrate, forming a metallization layer on the substrate, forming an upper dielectric layer over the metallization layer, forming a first sacrificial layer, a second sacrificial layer, and a third sacrificial layer penetrating the upper dielectric layer and the metallization layer, wherein the first sacrificial layer is aligned with the third sacrificial layer along a first axis, and the second sacrificial layer is free from overlapping the first sacrificial layer and the third sacrificial layer along the first axis, forming a width controlling structure between the first sacrificial layer and the third sacrificial layer, wherein the width controlling structure defines a recess exposing the upper dielectric layer, forming a protective layer within the recess, removing the width controlling structure to expose a portion of the metallization layer, patterning the metallization layer to form a first word line surrounding the first sacrificial layer, a second word line surrounding the second sacrificial layer, and a third word line surrounding the third sacrificial layer.

Another aspect of the present disclosure provides a method for manufacturing a semiconductor device. The method includes providing a substrate, forming a metallization layer on the substrate, forming an upper dielectric layer over the metallization layer, forming a first sacrificial layer and a second sacrificial layer penetrating the upper dielectric layer and the metallization layer, removing a portion of the upper dielectric layer between the first sacrificial layer and the second sacrificial layer to expose the metallization layer, forming a width controlling structure to cover a first portion of the metallization layer and expose a second portion of the metallization, and patterning the metallization layer to form a first word line surrounding the first sacrificial layer and a second word line surrounding the second sacrificial layer.

The embodiments of the present disclosure provide a method of manufacturing a semiconductor device. In this embodiment, the pattern of the word line may be determined by a width controlling structure. Further, the word line may be formed without using a photolithography process, which may cause overlay error and then result in electrical leakage between a channel layer and the word line. Further, the width of the word line may be controlled accurately by determining the thickness of the width controlling structure. Thus, the performance of the semiconductor device may be improved.

The foregoing has outlined rather broadly the features and is technical advantages of the present disclosure so that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1A:
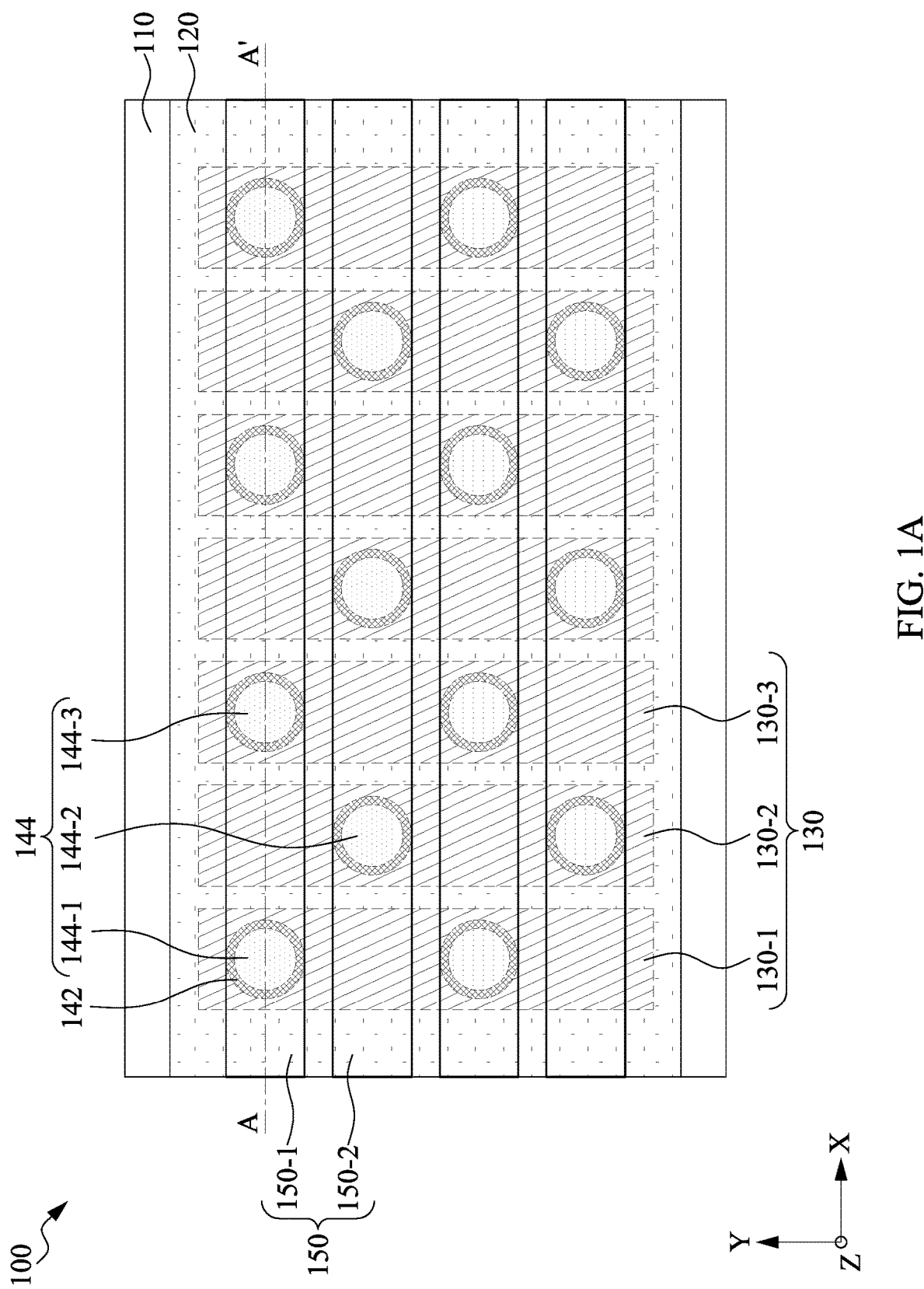
FIG. 1A is a top view of a semiconductor device, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that when an element is referred to as being "connected to" or "coupled to" another element, the initial element may be directly connected to, or coupled to, another element, or to other intervening elements.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

It should be noted that the term "about" modifying the quantity of an ingredient, component, or reactant of the present disclosure employed refers to variation in the numerical quantity that may occur, for example, through typical measuring and liquid handling procedures used for making concentrates or solutions. Furthermore, variation may occur from inadvertent error in measuring procedures, differences in the manufacture, source, or purity of the ingredients employed to make the compositions or carry out the methods, and the like. In one aspect, the term "about" means within 10% of the reported numerical value.

In another aspect, the term "about" means within 5% of the reported numerical value. In yet another aspect, the term "about" means within 9, 8, 7, 6, 5, 4, 3, 2, or 1% of the reported numerical value.

FIG. 1A is a top view of a semiconductor device 100, in is accordance with some embodiments of the present disclosure.

Figure 1B:
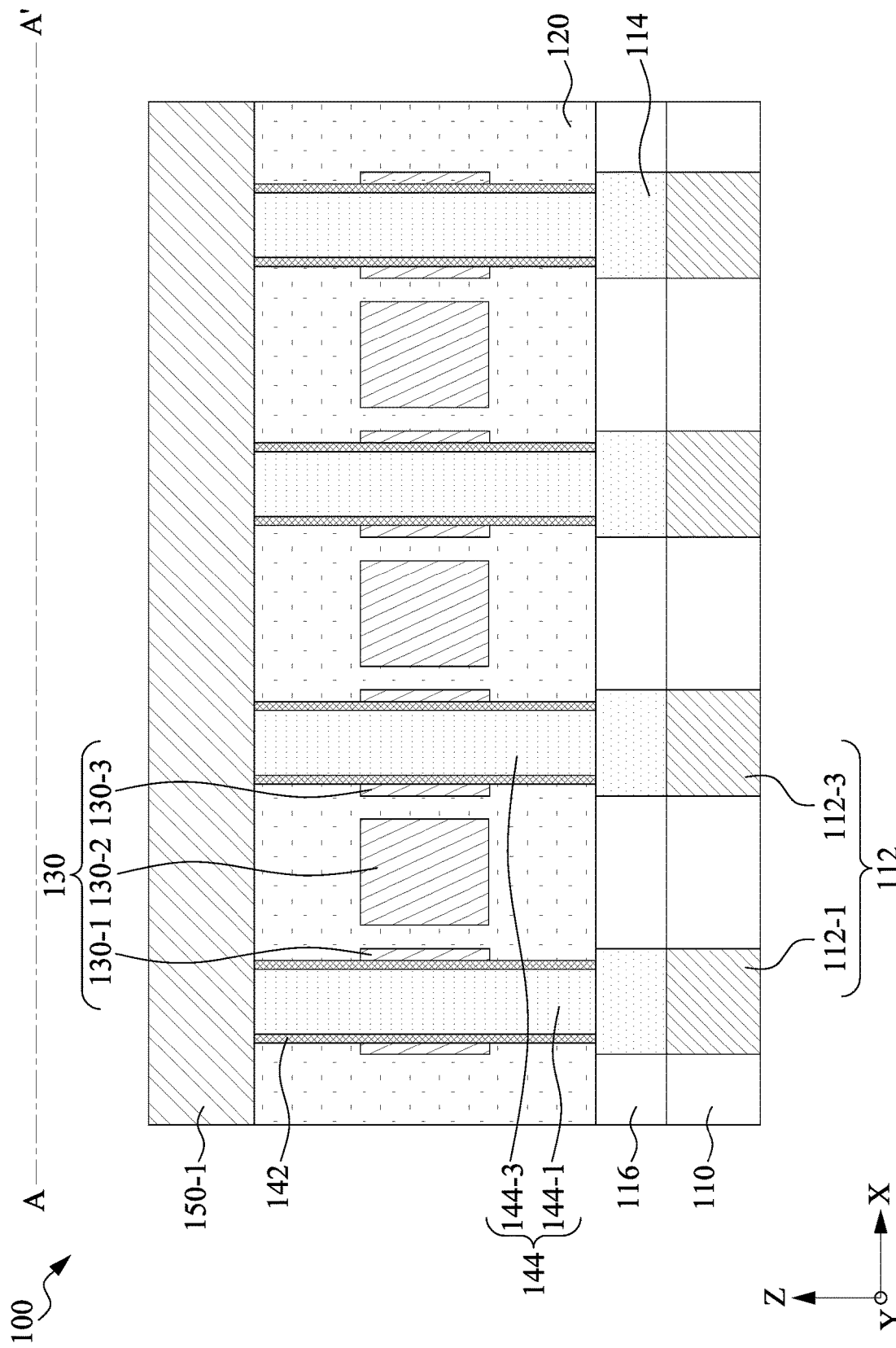
FIG. 1B is a cross-section along line A-A' of the semiconductor device as shown in FIG. 1A, in accordance with some embodiments of the present disclosure.

In some embodiments, the semiconductor device 100 may include a cell region in which a memory device, such as the structure shown in FIG. 1A and FIG. 1B, is formed. The memory device may include, for example, a dynamic random access memory (DRAM) device, a one-time programming (OTP) memory device, a static random access memory (SRAM) device, or other suitable memory devices. In some embodiments, a DRAM may include, for example, a transistor, a capacitor, and other components. During a read operation, a word line may be asserted, turning on the transistor. The enabled transistor allows the voltage across the capacitor to be read by a detection amplifier through a bit line. During a write operation, the data to be written may be provided on the bit line when the word line is asserted.

In some embodiments, the semiconductor device 100 may include a peripheral region (not shown) utilized to form a logic device (e.g., system-on-a-chip (SoC), central processing unit (CPU), iHaphics processing unit (GPU), application processor (AP), microcontroller, etc.), a radio frequency (RF) device, a sensor device, a micro-electro-mechanical-system (MEMS) device, a signal processing device (e.g., digital signal processing (DSP) device)), a front-end device (e.g., analog front-end (AFE) devices) or other devices.

As shown in FIG. 1A, the semiconductor device 100 may include a substrate 110, a dielectric structure 120, a plurality of word lines 130, a plurality of gate dielectric layers 142, a plurality of channel layers 144, and a plurality of bit lines 150.

The substrate 110 may be a semiconductor substrate, such as a bulk semiconductor, a semiconductor-on-insulator (SOI) substrate, or the like. The substrate 110 may include an elementary semiconductor including silicon or germanium in a single crystal form, a polycrystalline form, or an amorphous form; a compound semiconductor material including at least one of silicon carbide, gallium arsenide, gallium phosphide, indium phosphide, indium arsenide, and indium antimonide; an alloy semiconductor material including at least one of SiGe, GaAsP, AlInAs, AlGaAs, GaInAs, GaInP, and GaInAsP; any other suitable material; or a combination thereof. In some embodiments, the alloy semiconductor substrate may include a SiGe alloy with a gradient Ge feature in which the Si and Ge composition changes from one ratio at one location to another ratio at another location of the gradient SiGe feature. In another embodiment, the SiGe alloy is formed over a silicon substrate. In some embodiments, a SiGe alloy may be mechanically strained by another material in contact with the SiGe alloy. In some embodiments, the substrate 110 may have a multilayer structure, or the substrate 110 may include a multilayer compound semiconductor structure.

The substrate 110 may have multiple doped regions (not shown) therein. In some embodiments, p type and/or n type dopants may be doped in the substrate 110. In some embodiments, p type dopants include boron (B), other group III elements, or any combination thereof. In some embodiments, n type dopants include arsenic (As), phosphorus (P), other group V elements, or any combination thereof.

The dielectric structure 120 may be disposed on the substrate 110. In some embodiments, the dielectric structure 120 may include a multilayered structure. In some embodiments, the dielectric structure 120 may include silicon oxide ($SiO_x$), silicon nitride ($Si_xN_y$), silicon oxynitride (SiON), or other suitable materials.

Each of the word lines 130 (e.g., 130-1, 130-2, and 130-3) may extend along the Y-axis. Each of the word lines 130 may be parallel. In some embodiments, each of the word lines 130 may be physically separated by the dielectric structure 120. The word line 130 may include conductive materials, such as tungsten (W), copper (Cu), aluminum (Al), tantalum (Ta), molybdenum (Mo), tantalum nitride (TaN), titanium, titanium nitride (TiN), the like, and/or a combination thereof.

In some embodiments, the gate dielectric layer 142 may be disposed on the substrate 110. In some embodiments, each of the gate dielectric layers 142 may be surrounded by a corresponding word line 130. In some embodiments, the gate dielectric layer 142 may have a ring shape or other suitable profiles. However, the present disclosure is not intended to be limiting. In some embodiments, the gate dielectric layer 142 may include silicon oxide ($SiO_x$), silicon nitride ($Si_xN_y$), silicon oxynitride (SiON), or a combination thereof. In some embodiments, the gate dielectric layer may include dielectric material(s), such as high-k dielectric material. The high-k dielectric material may have a dielectric constant (k value) exceeding 4. The high-k material may include hafnium oxide ($HfO_2$), zirconium oxide ($ZrO_2$), lanthanum oxide ($La_2O_3$), yttrium oxide ($Y_2O_3$), aluminum oxide ($Al_2O_3$), titanium oxide ($TiO_2$) or another applicable material. Other suitable materials are within the contemplated scope of this disclosure.

In some embodiments, the channel layer 144 may be disposed on the substrate 110. In some embodiments, each of the channel layers 144 may be surrounded by a corresponding gate dielectric layer 142. In some embodiments, the channel layer 144 may be surrounded by the word line 130. For example, the channel layer 144-1 may be surrounded by the word line 130-1. The channel layer 144-2 may be surrounded by the word line 130-2. The channel layer 144-3 may be surrounded by the word line 130-3. The channel layer 144-1 may be aligned with the channel layer 144-3 along the X-axis. The channel layer 144-2 may be misaligned with the channel layer 144-1 (or channel layer 144-3) along the X-axis. In some embodiments, the channel layer 144 may have a circular, elliptical, oval, or other suitable profiles. However, the present disclosure is not intended to be limiting.

The material of the channel layer 144 may include an amorphous semiconductor, a poly-semiconductor and/or metal oxide. The semiconductor may include, but is not limited to, germanium (Ge), silicon (Si), tin (Sn), antimony (Sb). The metal oxide may include, but is not limited to, indium oxide, tin oxide, zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also represented as IGZO), an In—Al—Zn-based oxide, an In—S based oxide (also represented as ITO), an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an is In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, and a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide. However, the present disclosure is not intended to be limiting.

Each of the bit lines 150 (e.g., 150-1 and 150-2) may extend along the X-axis. Each of the bit lines 150 may be parallel. Each of the bit lines 150 may be physically separated. In some embodiments, the bit line 150 may be located at a horizontal level (or height) higher than that of the word line 130. The bit line 150-1 may cover the channel layers 144-1 and 144-3. The bit line 150-2 may cover the channel layer 144-2. The bit line 150 may include conductive materials, such as tungsten, copper, aluminum, tantalum, tantalum nitride, titanium, titanium nitride, the like, and/or a combination thereof. However, the present disclosure is not intended to be limiting.

FIG. 1B is a cross-section along line A-A of the semiconductor device 100 as shown in FIG. 1A, in accordance with some embodiments of the present disclosure.

As shown in FIG. 1B, the semiconductor device 100 further includes capacitor structures 112 (e.g., 112-1 and 112-3). In some embodiments, the channel layer 144-1 may cover, or vertically overlap, the capacitor structure 112-1. In some embodiments, the channel layer 144-3 may cover, or vertically overlap, the capacitor structure 112-3. In some embodiments, each of the capacitor structures 112-1 and 112-3 may have a circular profile, an oval profile, an elliptical profile, or the like from a top view.

In some embodiments, each of the capacitor structures 112-1 and 112-3 may include a first electrode, a capacitor dielectric, and a second electrode (not annotated in the figures). In some embodiments, the capacitor dielectric may surround the first electrode. In some embodiments, the second electrode may surround the first electrode. In some embodiments, the second electrode may surround the capacitor dielectric. In some embodiments, the capacitor dielectric may be disposed between the first electrode and the second electrode.

The first electrode and/or second electrode may include a semiconductor material or a conductive material. The semiconductor material may include polysilicon or other suitable materials. The conductive material may include tungsten, copper, aluminum, tantalum, or other suitable materials.

The capacitor dielectric may include dielectric materials, such as silicon oxide, tungsten oxide, zirconium oxide, copper oxide, aluminum oxide, hafnium oxide, or the like.

The semiconductor device 100 may further include contact plugs 114. In some embodiments, the contact plug 114 may be disposed on the capacitor structure 112. In some embodiments, the contact plug 114 may be configured to connect the capacitor structure 112 and the channel layer 144. In some embodiments, the contact plug 114 may include metal, such as tungsten (W), copper (Cu), ruthenium (Ru), iridium (Ir), nickel (Ni), osmium (Os), ruthenium (Rh), aluminum (Al), molybdenum (Mo), cobalt (Co), alloys thereof, or a combination thereof.

The semiconductor device 100 may further include an isolation layer 116. The isolation layer 116 may separate the plurality of capacitor structures 112. The isolation layer 116 may include, for example, silicon oxide ($SiO_2$), silicon nitride ($Si_3N_4$), silicon oxynitride ($N_2OSi_2$), silicon nitride oxide ($N_2OSi_2$), a high-k material or combinations thereof. The dielectric layer contact plug 114 may also be referred to as an interlayer dielectric.

As shown in FIG. 1B, the gate dielectric layer 142 may extend between the contact plug 114 and the bit line 150 (e.g., 150-1). The gate dielectric layer 142 may penetrate the dielectric structure 120. The gate dielectric layer 142 may penetrate the word line 130.

The channel layer 144 may extend between the contact plug 114 and the bit line 150 (e.g., 150-1). The channel layer 144 may penetrate the dielectric structure 120. The channel layer 144 may penetrate the word line 130.

Figure 2A:
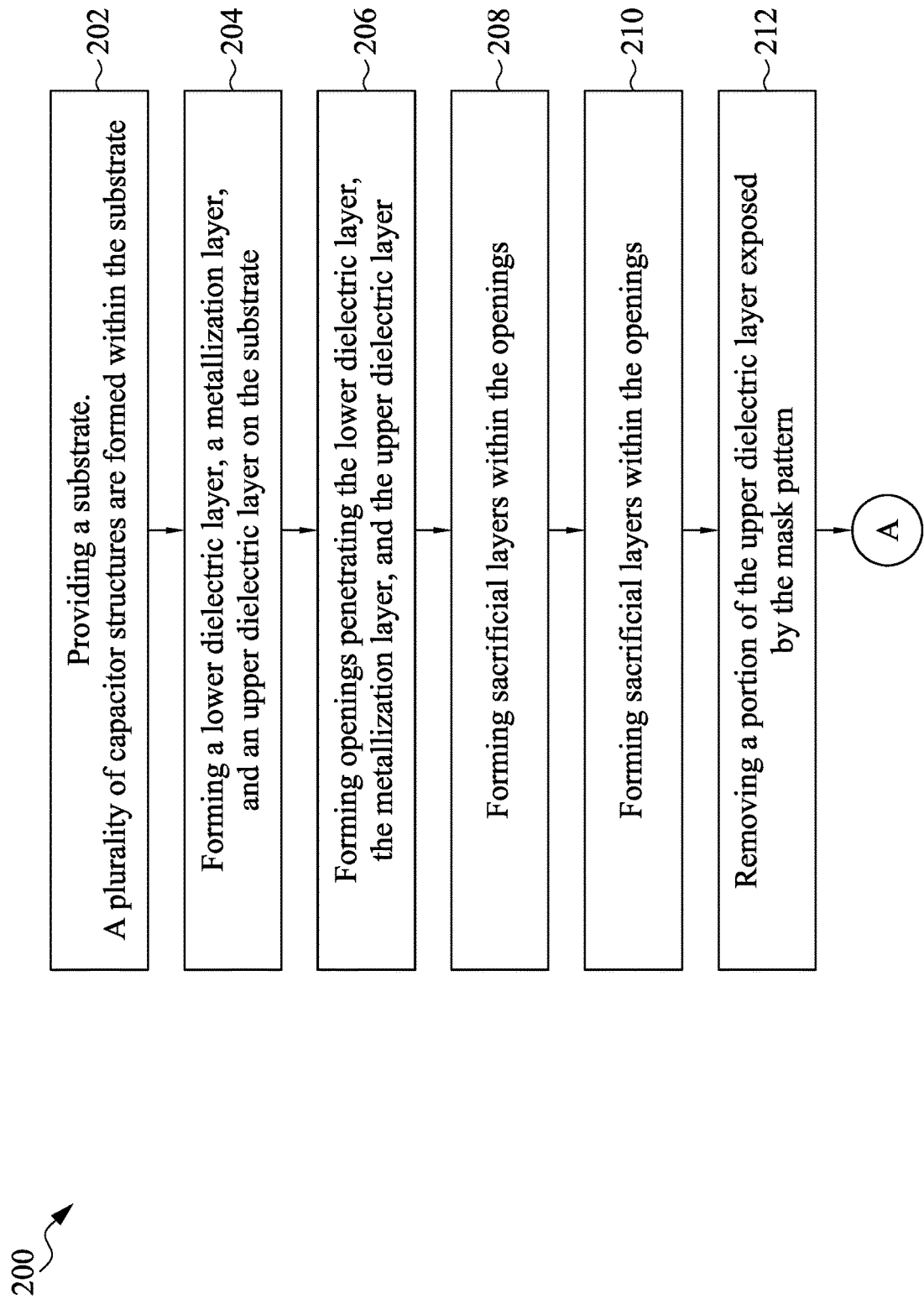
FIG. 2A, FIG. 2B, and FIG. 2C are flowcharts illustrating a method of manufacturing a semiconductor device, in accordance with some embodiments of the present disclosure.
Figure 2B:
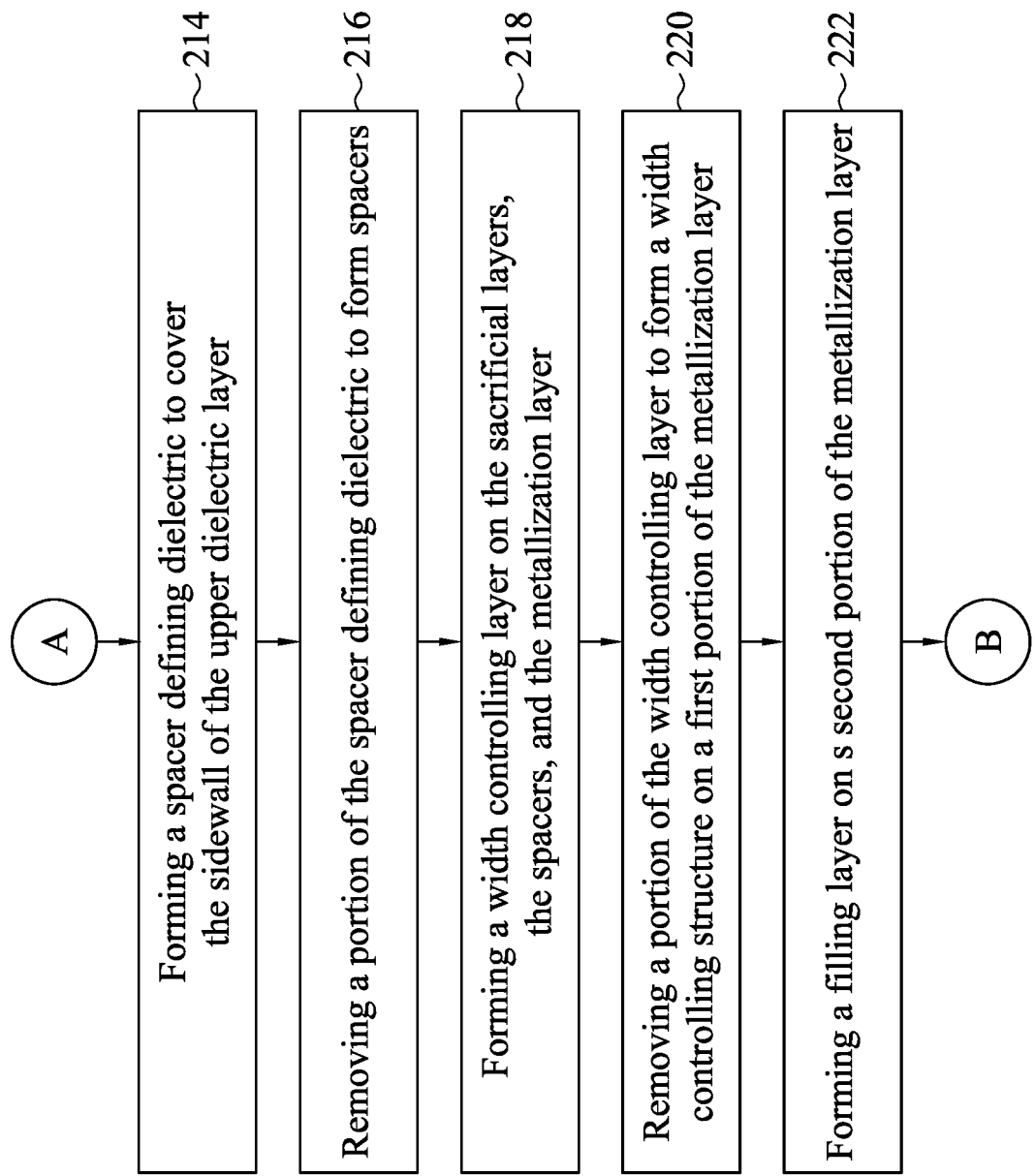
Figure 2C:
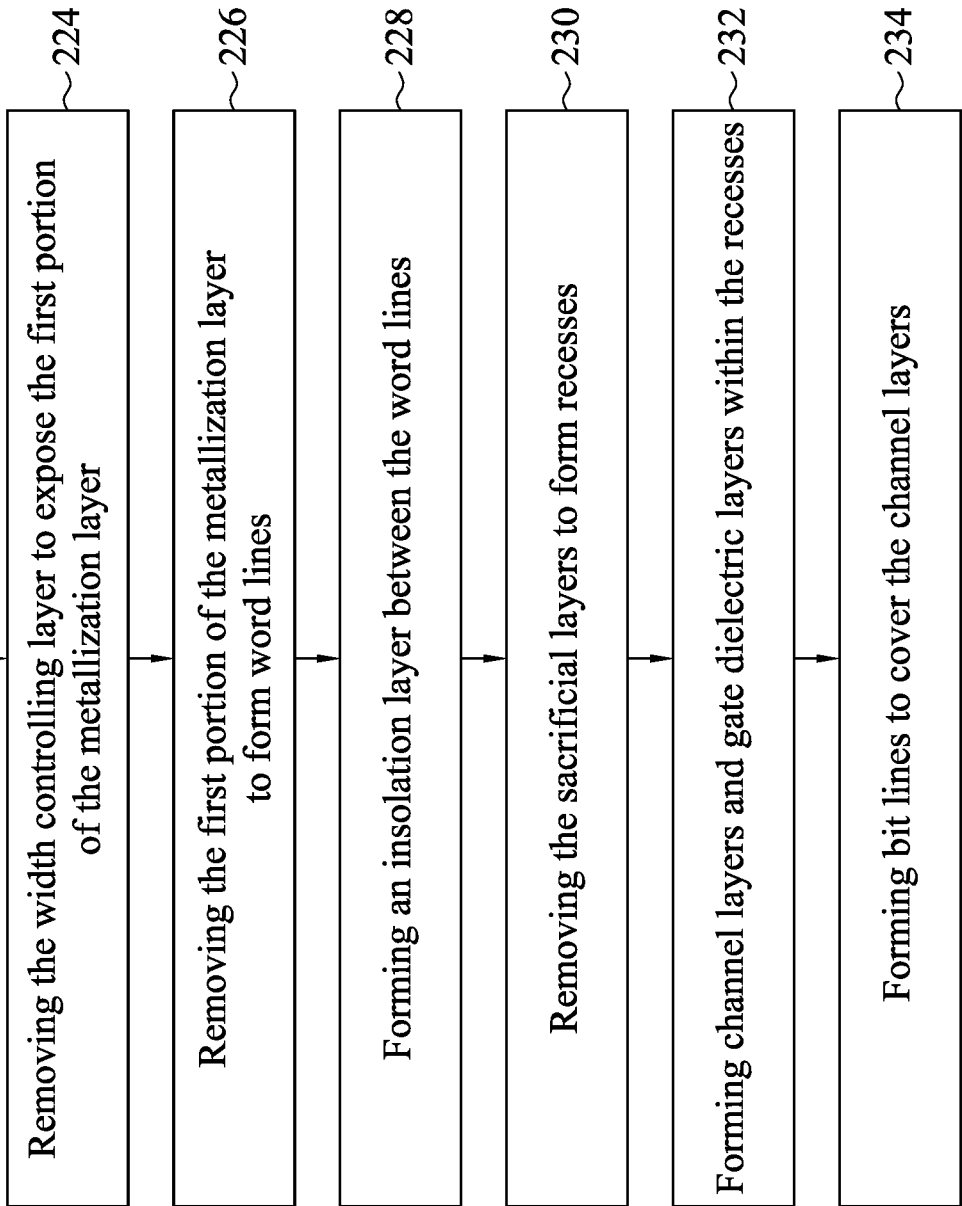

FIG. 2A, FIG. 2B, and FIG. 2C are flowcharts illustrating a method 200 of manufacturing a semiconductor device, in accordance with some embodiments of the present disclosure.

Referring to FIG. 2A, the method 200 begins with operation 202 in which a substrate is provided. In some embodiments, a plurality of capacitor structures (e.g., the first, second, and third capacitor structures) may be formed within the substrate. The first capacitor structure may be aligned with the third capacitor structure along a first axis. The second capacitor structure may be misaligned with the first capacitor structure (or third capacitor structure) along the first axis. In some embodiments, a plurality of contact plugs may be formed on the capacitor structure. In some embodiments, an isolation layer may be formed on the substrate. The isolation layer may be configured to separate the contact plugs.

The method 200 continues with operation 204 in which a lower dielectric layer, a metallization layer, and an upper dielectric layer may be formed. In some embodiments, the lower dielectric layer may be formed on the substrate. In some embodiments, the metallization layer may be formed on the lower dielectric layer. In some embodiments, the upper dielectric layer may be formed on the metallization layer.

The method 200 continues with operation 206 in which a plurality of openings (e.g., the first, second, and third openings) are formed. A portion of the lower dielectric layer, upper dielectric layer, and metallization layer may be removed. In some embodiments, each of the openings may penetrate the lower dielectric layer, upper dielectric layer, and metallization layer. In some embodiments, the isolation layer may be exposed by the opening.

The method 200 continues with operation 208 in which a plurality of sacrificial layers (e.g., the first, second, third sacrificial layers) may be formed. For example, the first sacrificial layer may be formed within the first opening. The second sacrificial layer may be formed within the second opening. The third sacrificial layer may be formed within the third opening. In some embodiments, the sacrificial layers may vertically overlap the capacitor structure. For example, the first sacrificial layer may vertically overlap the first capacitor structure. The second sacrificial layer may vertically overlap the second capacitor structure. The third sacrificial layer may vertically overlap the third capacitor structure. In some embodiments, the sacrificial layers may include polysilicon, gallium nitride, aluminum gallium nitride, titanium nitride, tantalum nitride, or other suitable materials.

The method 200 continues with operation 210 in which a mask pattern may be formed. In some embodiments, the mask pattern may include a first mask layer and a second mask layer. In some embodiments, each of the first mask layer and second mask layer may extend along a second axis, which is substantially perpendicular to the first axis. In some embodiments, the first mask layer may vertically overlap the first sacrificial layer. In some embodiments, the second mask layer may vertically overlap the third sacrificial layer. In some embodiments, the second sacrificial layer may be exposed by the mask pattern.

The method 200 continues with operation 212 in which a portion of the upper dielectric layer may be removed. In some embodiments, the portion of the upper dielectric layer exposed by the mask pattern may be removed. The upper dielectric layer may be free from overlapping the second capacitor structure. The sidewall of the upper dielectric layer may be exposed. For example, a first sidewall and a second sidewall of the upper dielectric layer may be exposed.

Referring to FIG. 2B, the method 200 continues with operation 214 in which a spacer-defining dielectric may be formed. In some embodiments, the spacer-defining dielectric may be conformally formed on the sacrificial layers and the metallization layer. The spacer-defining dielectric may cover the first sidewall and second sidewall of the upper dielectric layer.

The method 200 continues with operation 216 in which spacers (e.g., the first and second spacers) may be formed. In some embodiments, a portion of the spacer-defining dielectric may be removed to form the spacers. In some embodiments, the spacer-defining dielectric over the upper surface of the sacrificial layers and over the metallization layer may be removed. In some embodiments, the spacer may be formed on sidewalls of the upper dielectric layer. For example, the first spacer may be formed on the first sidewall of the dielectric structure. The second spacer may be formed on the second sidewall of the dielectric structure. In some embodiments, the spacer may extend along the second axis.

The method 200 continues with operation 218 in which a width controlling layer may be formed. In some embodiments, the width controlling layer may be conformally formed on the sacrificial layers, the spacers, and the metallization layer. In some embodiments, the material of the width controlling layer may be different from the spacer. In some embodiments, the thickness of the width controlling layer may be utilized to determine a width of word lines.

The method 200 continues with operation 220 in which a width controlling structure (or width control structure) may be formed. In some embodiments, the portions of the width controlling layer over the upper surface of the sacrificial layers, the upper dielectric layer, the spacers, and the metallization layer are removed. In some embodiments, the width controlling structure may be formed on the first sidewall and second sidewall of the upper dielectric layer.

In some embodiments, the width controlling structure may be formed on the sidewall of the spacer. In some embodiments, the thickness of the width controlling structure may be utilized to determine a width of a word line. In some embodiments, the width controlling structure may define a recess exposing the metallization layer. In some embodiments, the width controlling structure may cover a first portion of the metallization layer. In some embodiments, a second portion of the metallization layer may be exposed by the width controlling structure.

The method 200 continues with operation 222 in which a filling layer may be formed. In some embodiments, the filling layer may be formed within the recess. In some embodiments, the filling layer may cover the second portion of the metallization layer.

Referring to FIG. 2C, the method 200 continues with operation 224 in which the width controlling structure may be removed. In some embodiments, the first portion of the metallization layer may be exposed by the sacrificial layers, upper dielectric layer, the spacer, and the filling layer.

The method 200 continues with operation 226 in which word lines (e.g., the first, second, third word lines) may be formed. In some embodiments, the first portion of the metallization layer may be removed. In some embodiments, the second portion of the metallization layer may be utilized to define the word line. In some embodiments, the width of the word line may be determined by the thickness of the width controlling structure. In some embodiments, a portion of the lower dielectric layer may be removed. A trench may be formed.

The method 200 continues with operation 228 in which an isolation layer may be formed. In some embodiments, the isolation layer may be formed within the trench, thereby producing a dielectric structure.

The method 200 continues with operation 230 in which a plurality of recesses (e.g., the first, second, and third recesses) may be formed. In some embodiments, the sacrificial layers may be removed to form recesses. In some embodiments, the recesses may penetrate the dielectric structure and the word line.

The method 200 continues with operation 232 in which gate dielectric layers and channel layers (e.g., the first, second, and third channel layers) may be formed. In some embodiments, the gate dielectric layer may be formed within the first recess, second recess, and third recess. In some embodiments, the first channel layer may be formed within the first recess. In some embodiments, the second channel layer may be formed within the second recess. In some embodiments, the third channel layer may be formed within the third recess.

The method 200 continues with operation 234 in which bit lines (e.g., the first bit line and second bit lines) may be formed. In some embodiments, the first bit line may cover the first channel layer and the third channel layer. In some embodiments, the second bit line may cover the second channel layer.

FIG. 3A, FIG. 4A, FIG. 5A, FIG. 6A, FIG. 7A, FIG. 8A, FIG. 9A, FIG. 10A, FIG. 11A, FIG. 12A, FIG. 13A, FIG. 14A, FIG. 15A, FIG. 16A, FIG. 17A, FIG. 18A, and FIG.

19A illustrate one or more stages of an exemplary method for manufacturing a semiconductor device according to some embodiments of the present disclosure. FIG. 3B, FIG. 4B, FIG. 5B, FIG. 6B, FIG. 7B, FIG. 8B, FIG. 9B, FIG. 10B, FIG. 11B, FIG. 12B, FIG. 13B, FIG. 14B, FIG. 15B, FIG. 16B, FIG. 17B, FIG. 18B, and FIG. 19B are cross-sections of FIG. 3A, FIG. 4A, FIG. 5A, FIG. 6A, FIG. 7A, FIG. 8A, FIG. 9A, FIG. 10A, FIG. 11A, FIG. 12A, FIG. 13A, FIG. 14A, FIG. 15A, FIG. 16A, FIG. 17A, FIG. 18A, and FIG. 19A, respectively. It should be noted that, for brevity, some elements are illustrated in cross-section but not in top views.

Figure 3A:
FIG. 3A illustrates one or more stages of an exemplary method for manufacturing a semiconductor device according to some embodiments of the present disclosure.
Figure 3B:
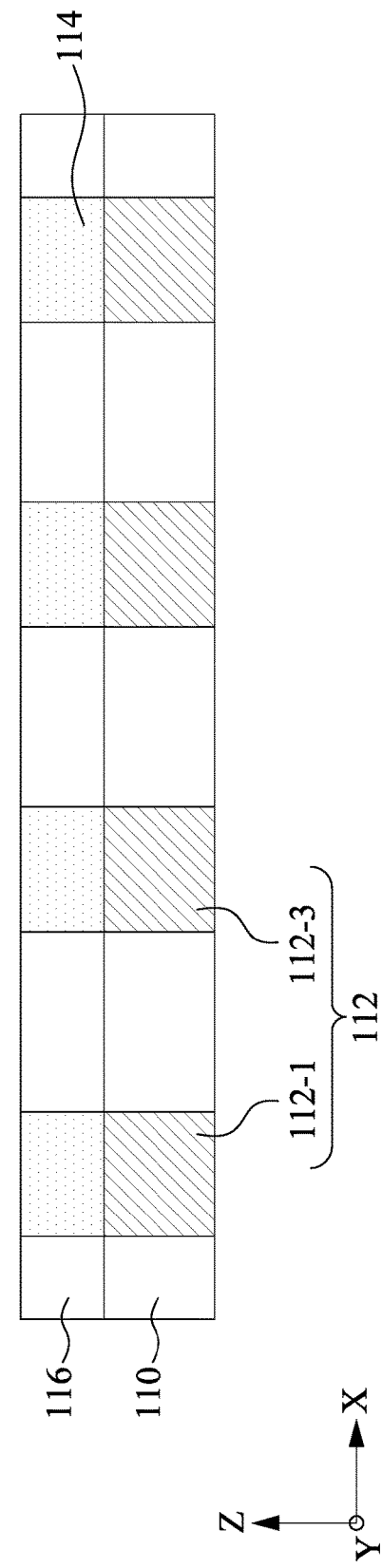
FIG. 3B is a cross-section along line A-A' of FIG. 3A, in accordance with some embodiments of the present disclosure.

Referring to FIG. 3A and FIG. 3B, a substrate 110 may be provided. In some embodiments, a plurality of capacitor structures 112 (e.g., 112-1 and 112-3) may be formed within the substrate 110. The capacitor structure 112-1 may be aligned with the capacitor structure 112-3 along the X-axis. In some embodiments, the capacitor structure 112 may have a circular, elliptical, oval, or other suitable profile. However, the present disclosure is not intended to be limiting. In some embodiments, contact plugs 114 may be formed on the capacitor structure 112. In some embodiments, an isolation layer 116 may be formed on the substrate 110. The isolation layer 116 may be configured to separate the contact plugs 114.

Figure 4A:
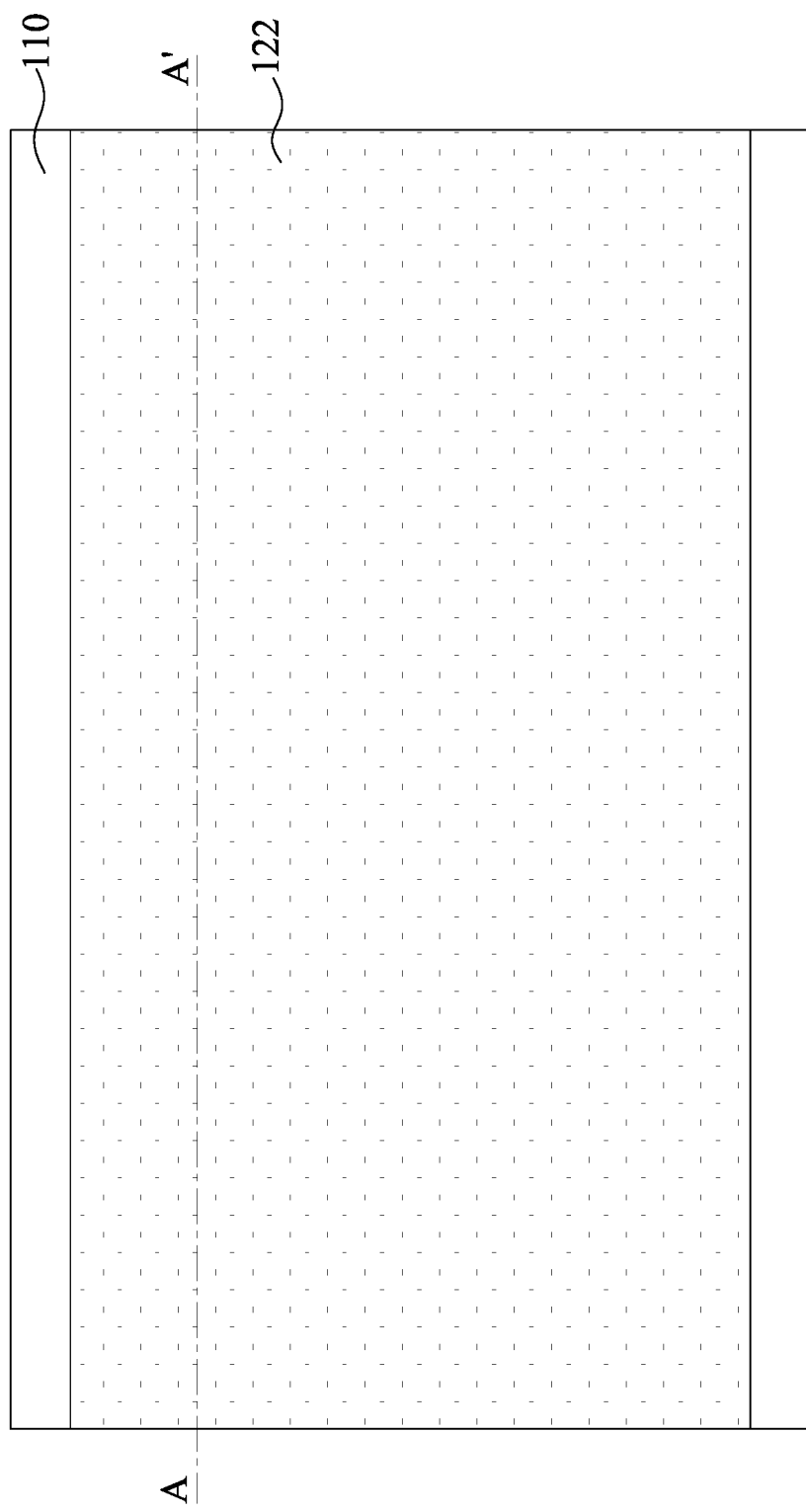
FIG. 4A illustrates one or more stages of an exemplary method for manufacturing a semiconductor device according to some embodiments of the present disclosure.
Figure 4B:
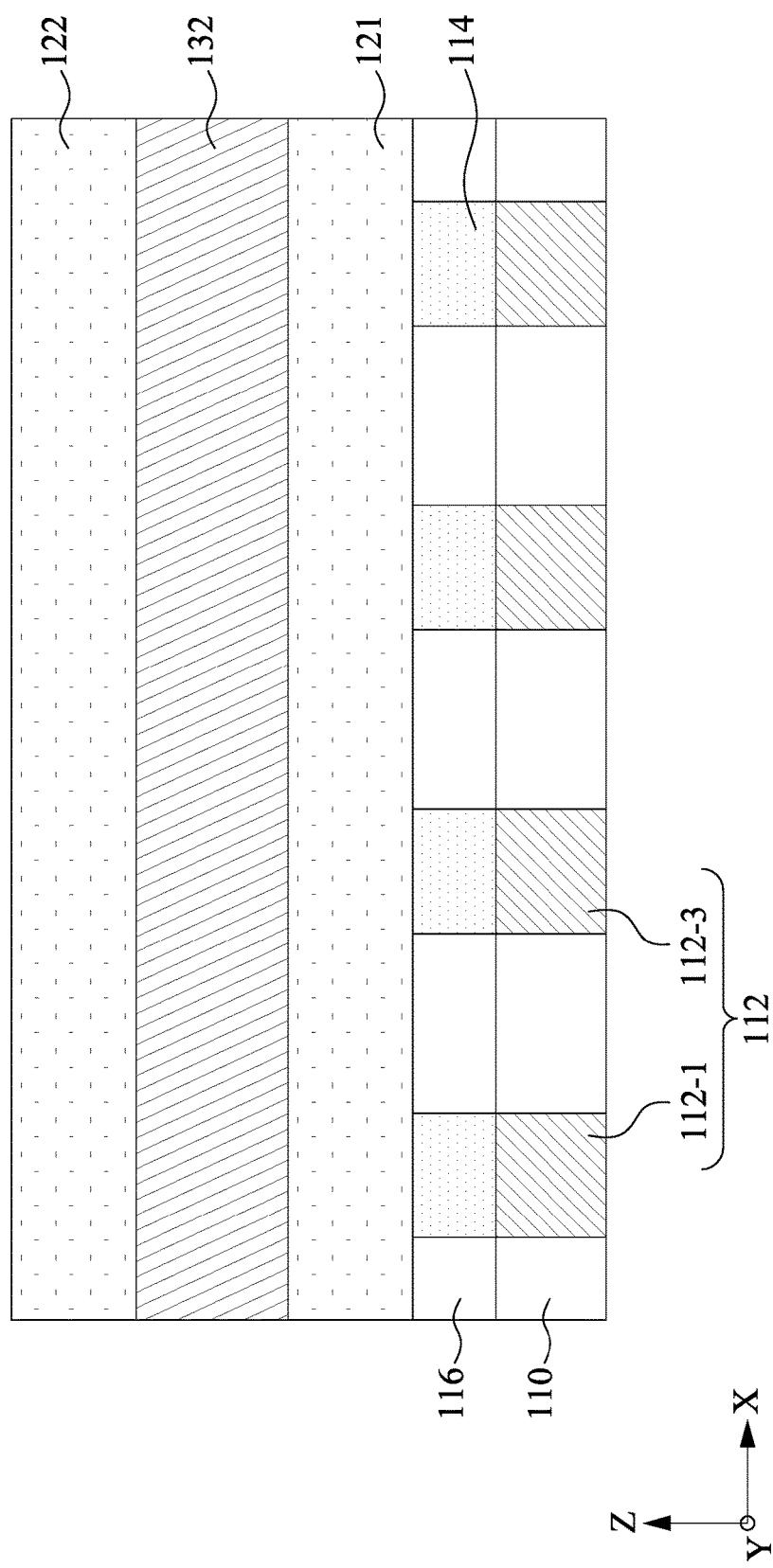
FIG. 4B is a cross-section along line A-A' of FIG. 4A, in accordance with some embodiments of the present disclosure.

Referring to FIG. 4A and FIG. 4B, a dielectric layer 121, a metallization layer 132, and a dielectric layer 122 may be formed. In some embodiments, the dielectric layer 121 (or a lower dielectric layer) may be formed on the substrate 110. In some embodiments, the metallization layer 132 may be formed on the dielectric layer 121. In some embodiments, the dielectric layer 122 (or an upper dielectric layer) may be formed on the metallization layer 132. The dielectric layer 121 and/or 122 may include silicon oxide ($SiO_x$), silicon nitride ($Si_xN_y$), silicon oxynitride (SiON), or other suitable materials. The metallization layer 132 may be configured to form word lines. The dielectric layer 121, dielectric layer 122, and metallization layer 132 may be formed by chemical vapor deposition (CVD), atomic layer deposition (ALD), physical vapor deposition (PVD), low-pressure chemical vapor deposition (LPCVD), plasma-enhanced CVD (PECVD), or other suitable processes.

Figure 5A:
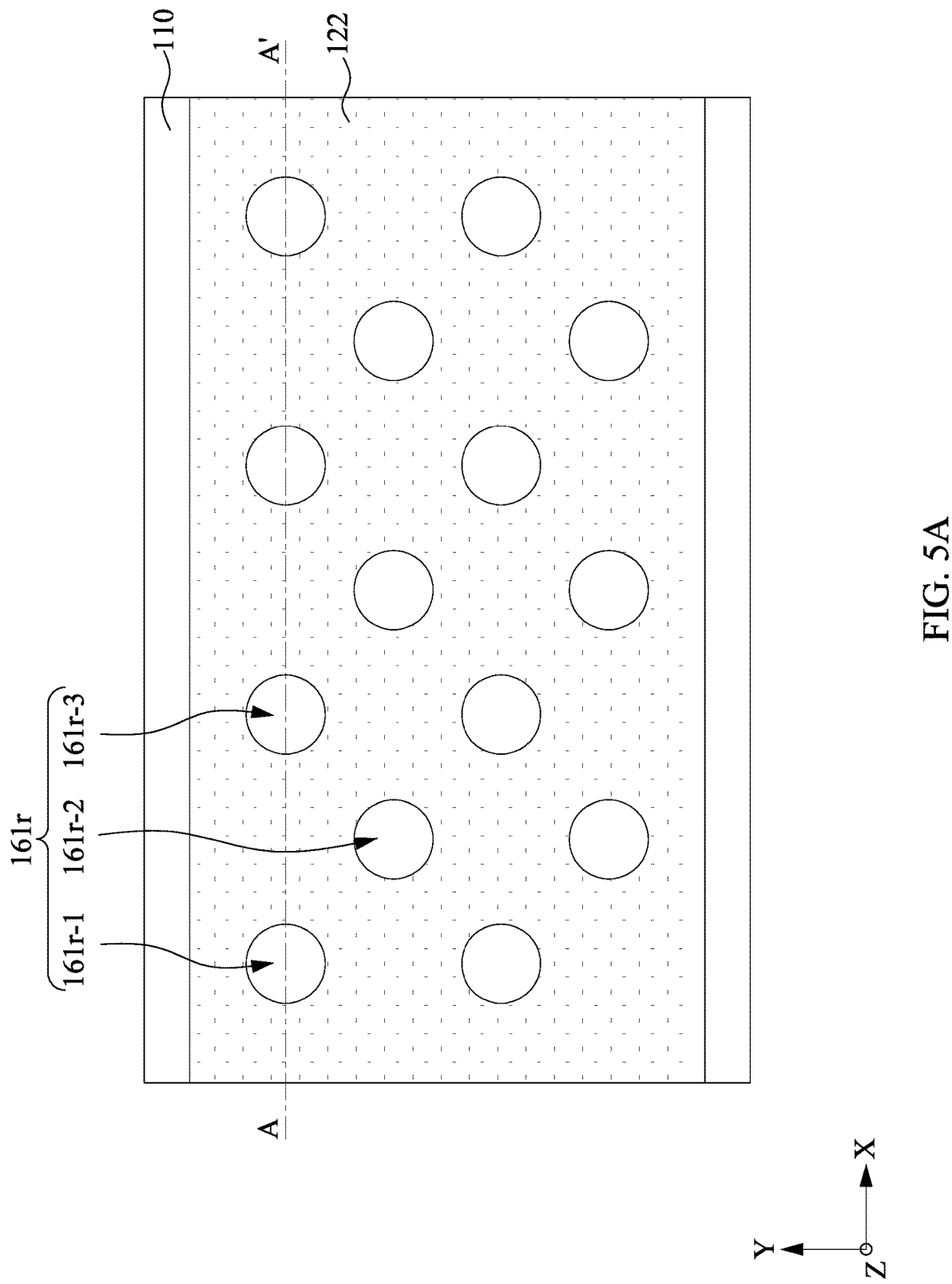
FIG. 5A illustrates one or more stages of an exemplary method for manufacturing a semiconductor device according to some embodiments of the present disclosure.
Figure 5B:
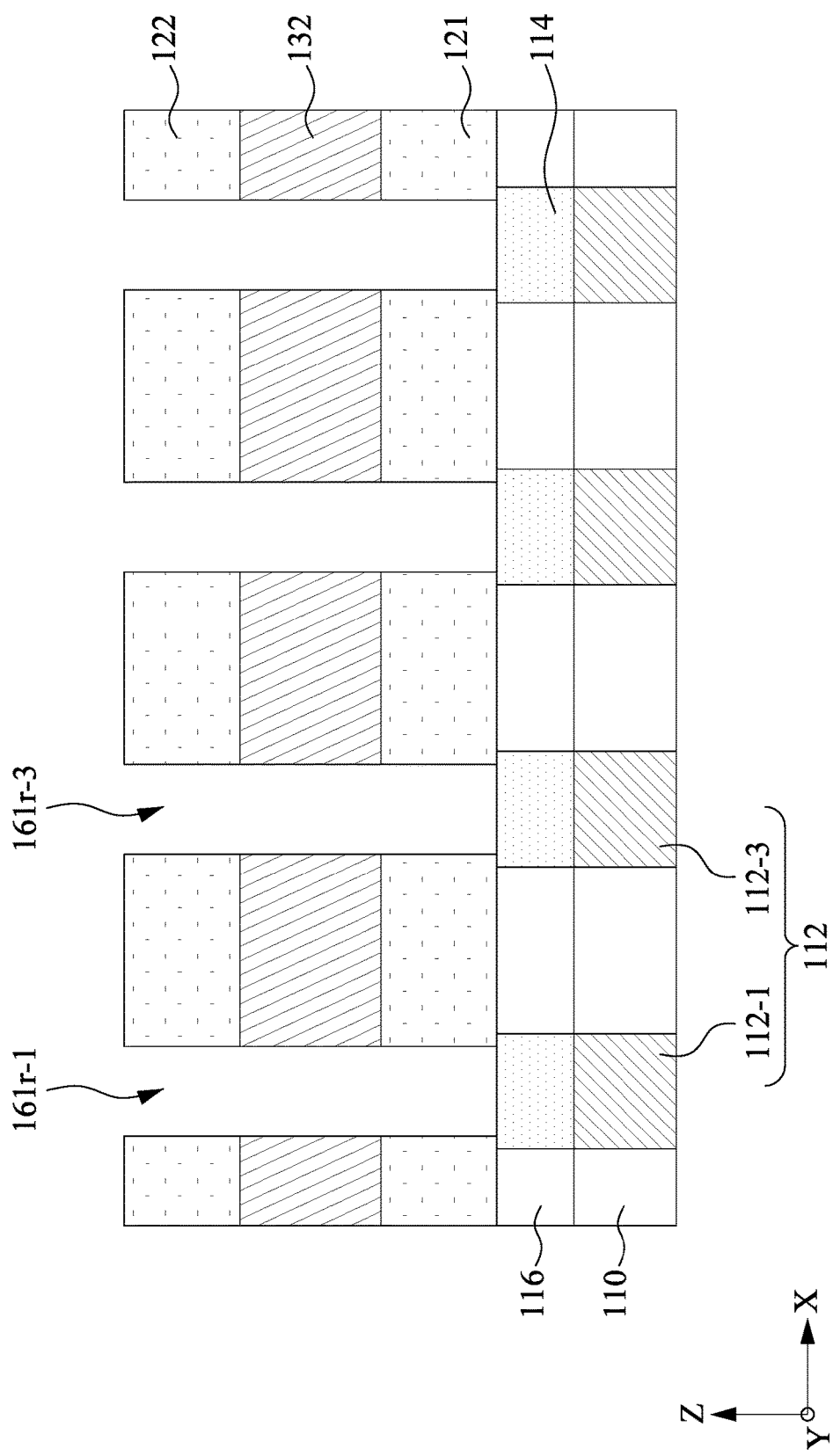
FIG. 5B is a cross-section along line A-A' of FIG. 5A, in accordance with some embodiments of the present disclosure.

Referring to FIG. 5A and FIG. 5B, a plurality of openings 161r (e.g., 161r-1, 161r-2, and 161r-3) are formed. A portion of the dielectric layer 121, dielectric layer 122, and metallization layer 132 may be removed. In some embodiments, the opening 161r may penetrate the dielectric layer 121, dielectric layer 122, and metallization layer 132. In some embodiments, the isolation layer 116 may be exposed by the opening 161r. In some embodiments, the opening 161r-1 may be aligned with the opening 161r-3 along the X-axis. The opening 161r-1 may be misaligned with the opening 161r-2 along the X-axis.

Figure 6A:
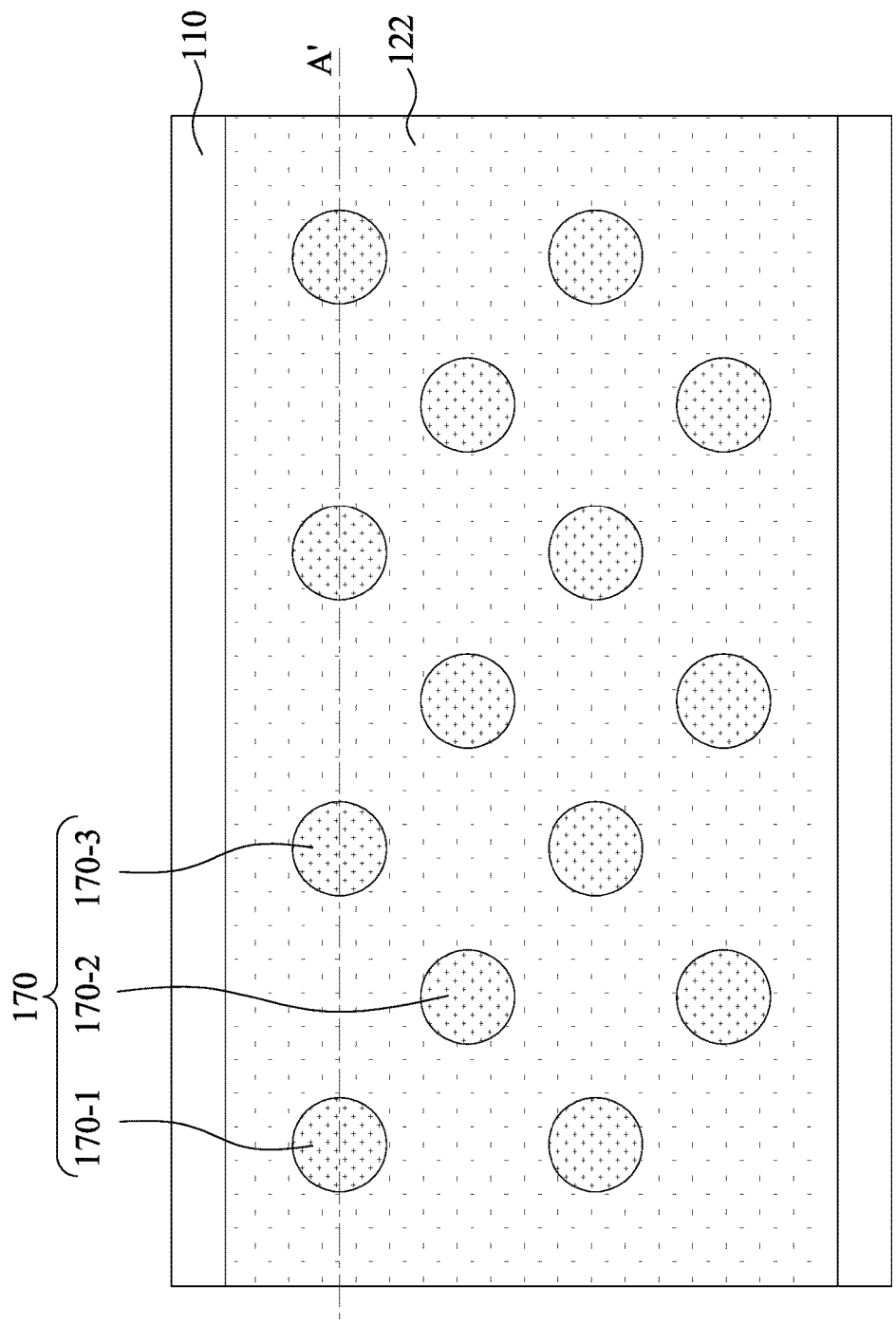
FIG. 6A illustrates one or more stages of an exemplary method for manufacturing a semiconductor device according to some embodiments of the present disclosure.
Figure 6B:
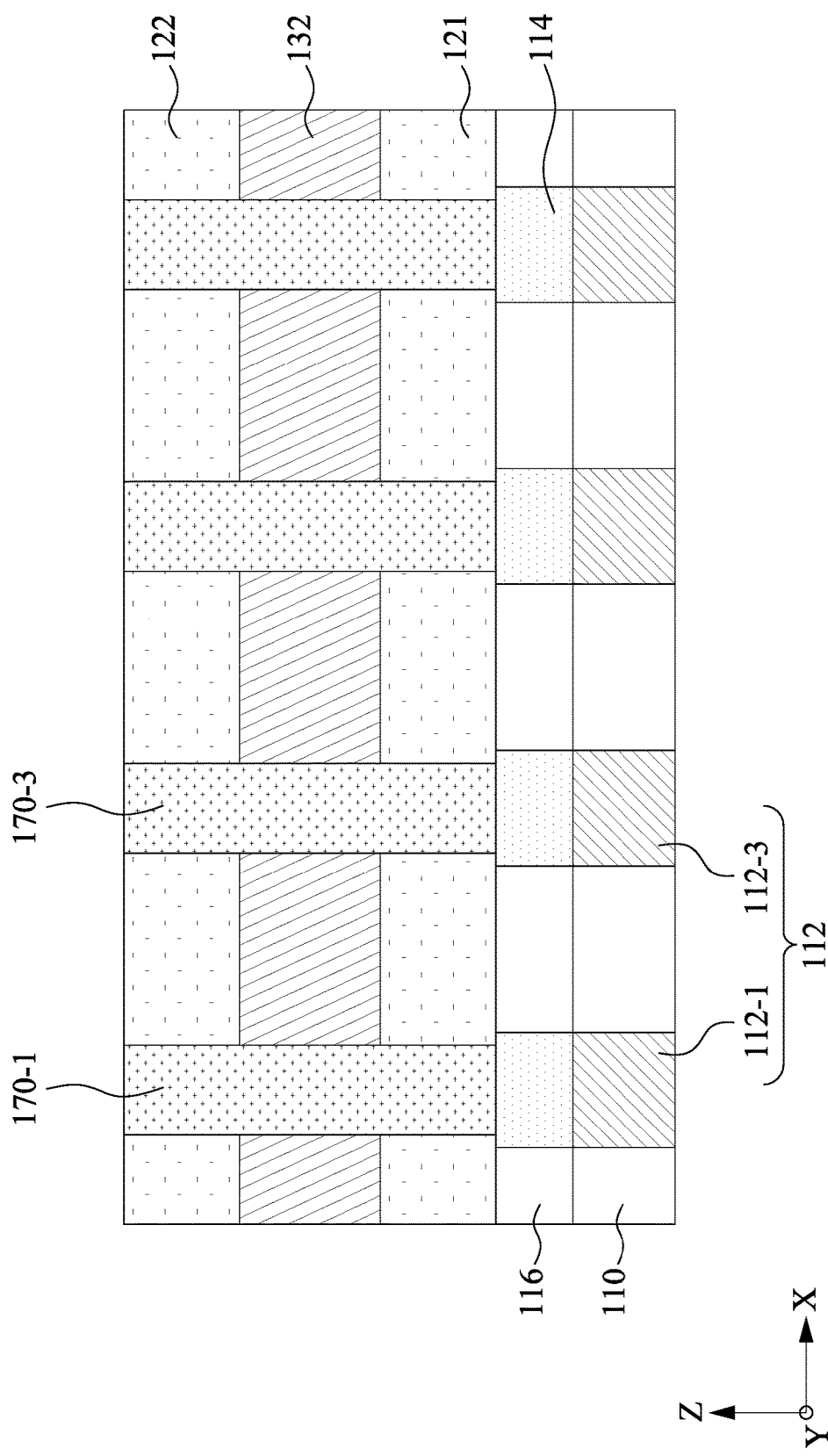
FIG. 6B is a cross-section along line A-A' of FIG. 6A, in accordance with some embodiments of the present disclosure.

Referring to FIG. 6A and FIG. 6B, a plurality of sacrificial layers 170 (e.g., 170-1, 170-2, and 170-3) may be formed. For example, the sacrificial layer 170-1 may be formed within the opening 161r-1. The sacrificial layer 170-2 may be formed within the opening 161r-2. The sacrificial layer 170-3 may be formed within the opening 161r-3. In some embodiments, the sacrificial layer 170 may vertically overlap or be aligned with the capacitor structure 112 along the Z-axis. For example, the sacrificial layer 170-1 may vertically overlap the capacitor structure 112-1. The sacrificial layer 170-3 may vertically overlap the capacitor structure 112-3. In some embodiments, the sacrificial layer 170-1 may be aligned with the sacrificial layer 170-3 along the X-axis. The sacrificial layer 170-1 may be misaligned with the sacrificial layer 170-2 along the X-axis.

In some embodiments, the material of the sacrificial layer 170 is different from that of the dielectric layer 121 (or 122). In some embodiments, the material of the sacrificial layer 170 is different from that of the metallization layer 132. In some embodiments, the sacrificial layer 170 may include polysilicon, gallium nitride, aluminum gallium nitride, titanium nitride, tantalum nitride, or other suitable materials. The sacrificial layer 170 may be formed by CVD, ALD, PVD, LPCVD, PECVD, or other suitable processes.

Figure 7A:
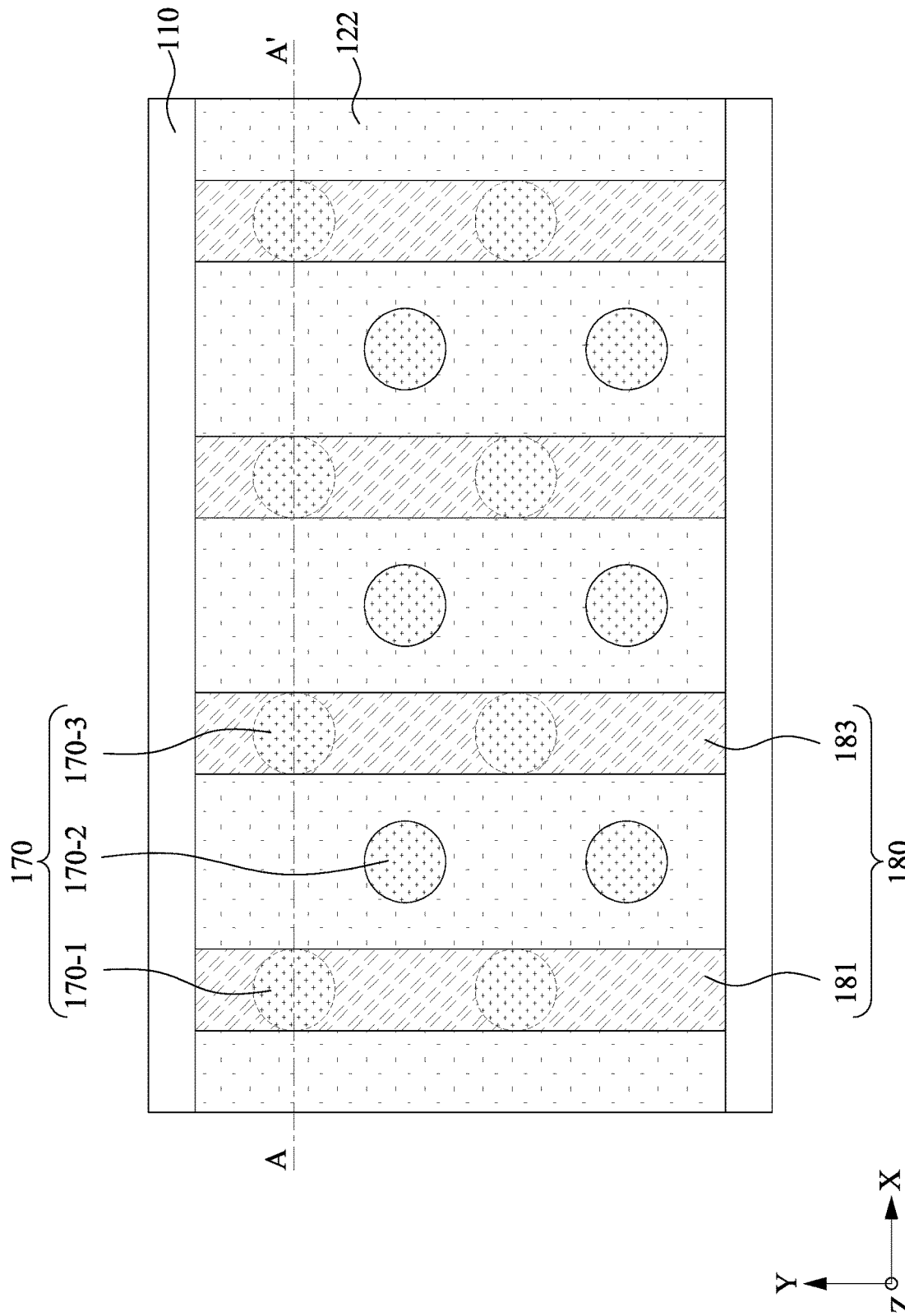
FIG. 7A illustrates one or more stages of an exemplary method for manufacturing a semiconductor device according to some embodiments of the present disclosure.
Figure 7B:
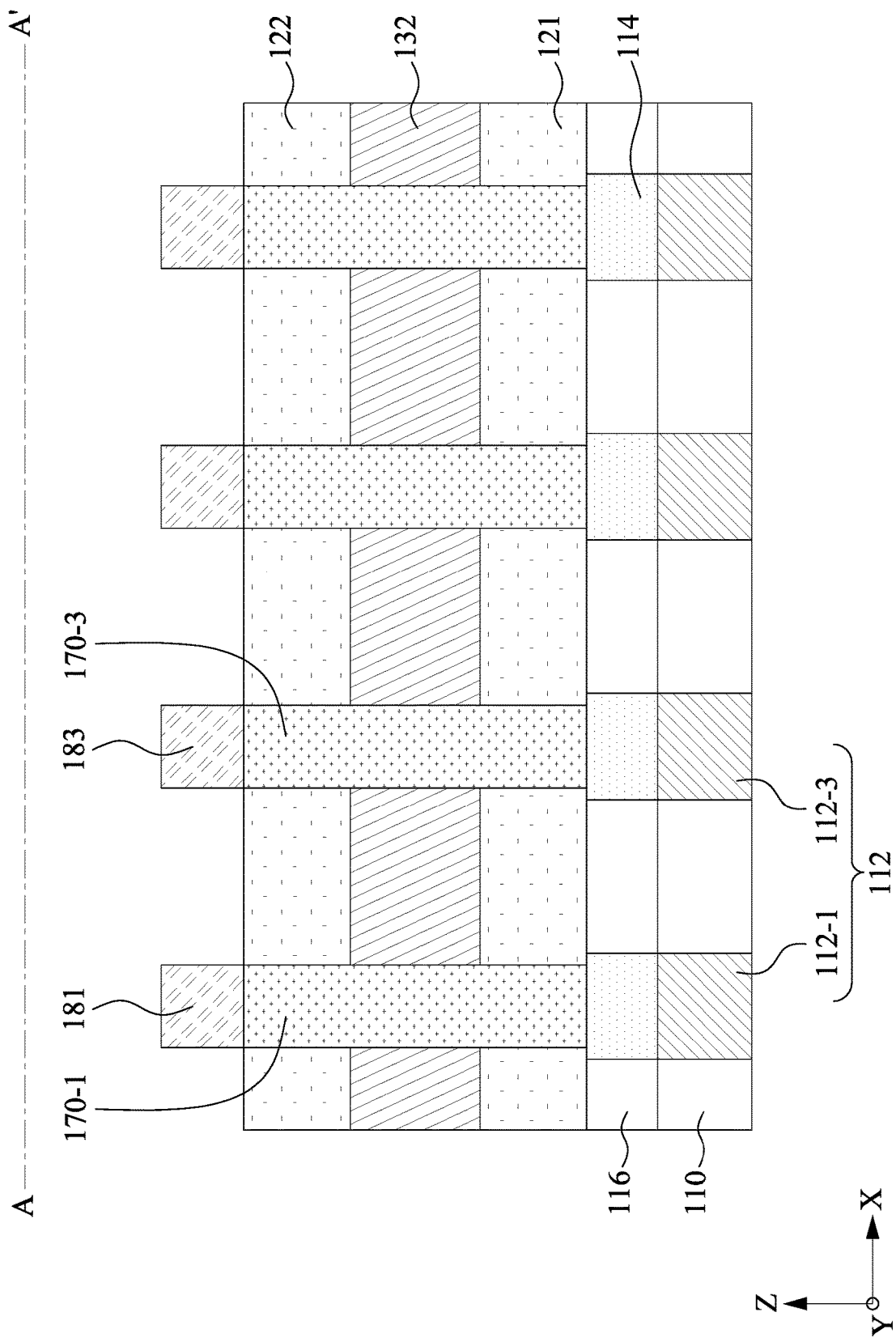
FIG. 7B is a cross-section along line A-A' of FIG. 7A, in accordance with some embodiments of the present disclosure.

Referring to FIG. 7A and FIG. 7B, a mask pattern 180 may be formed. In some embodiments, the mask pattern 180 may include a mask layer 181 and a mask layer 183. In some embodiments, each of the mask layers 181 and 183 may extend along the Y-axis. In some embodiments, the mask layer 181 may vertically overlap the sacrificial layer 170-1. In some embodiments, the mask layer 183 may vertically overlap the sacrificial layer 170-3. In some embodiments, the sacrificial layer 170-2 may be free from vertically overlapping the mask pattern 180.

In some embodiments, the mask pattern 180 may include a multilayered structure. The mask pattern 180 may include carbon, silicon oxide ($SiO_2$), such as flowable oxide (FOX), tonen silazene (TOSZ), undoped silica glass (USG), borosilica glass (BSG), phosphosilica glass (PSG), borophosphosilica glass (BPSG), plasma enhanced tetra ethyl ortho silicate (PE-TEOS), fluoride silicate glass (PSG) or other suitable materials.

Figure 8A:
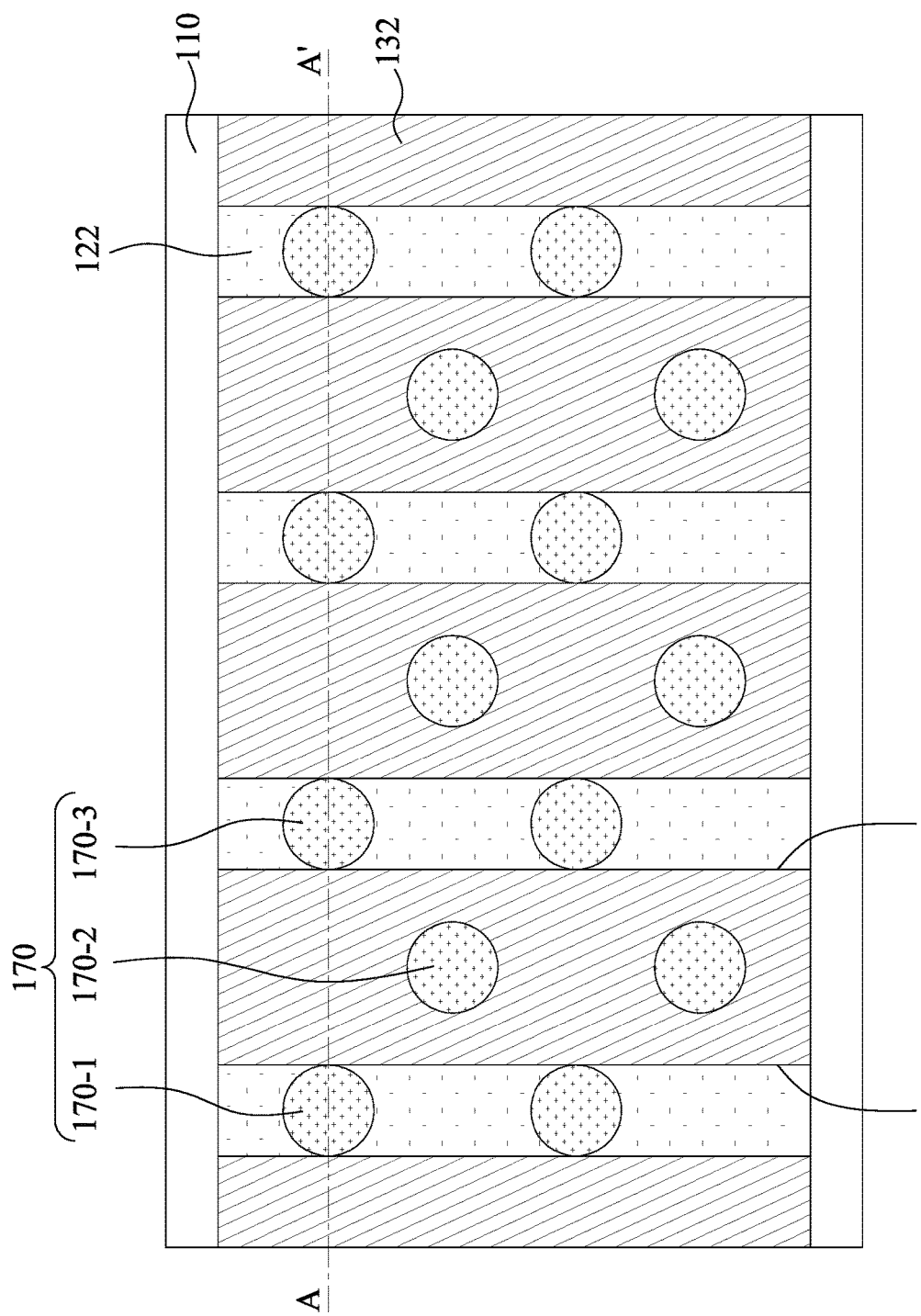
FIG. 8A illustrates one or more stages of an exemplary method for manufacturing a semiconductor device according to some embodiments of the present disclosure.
Figure 8B:
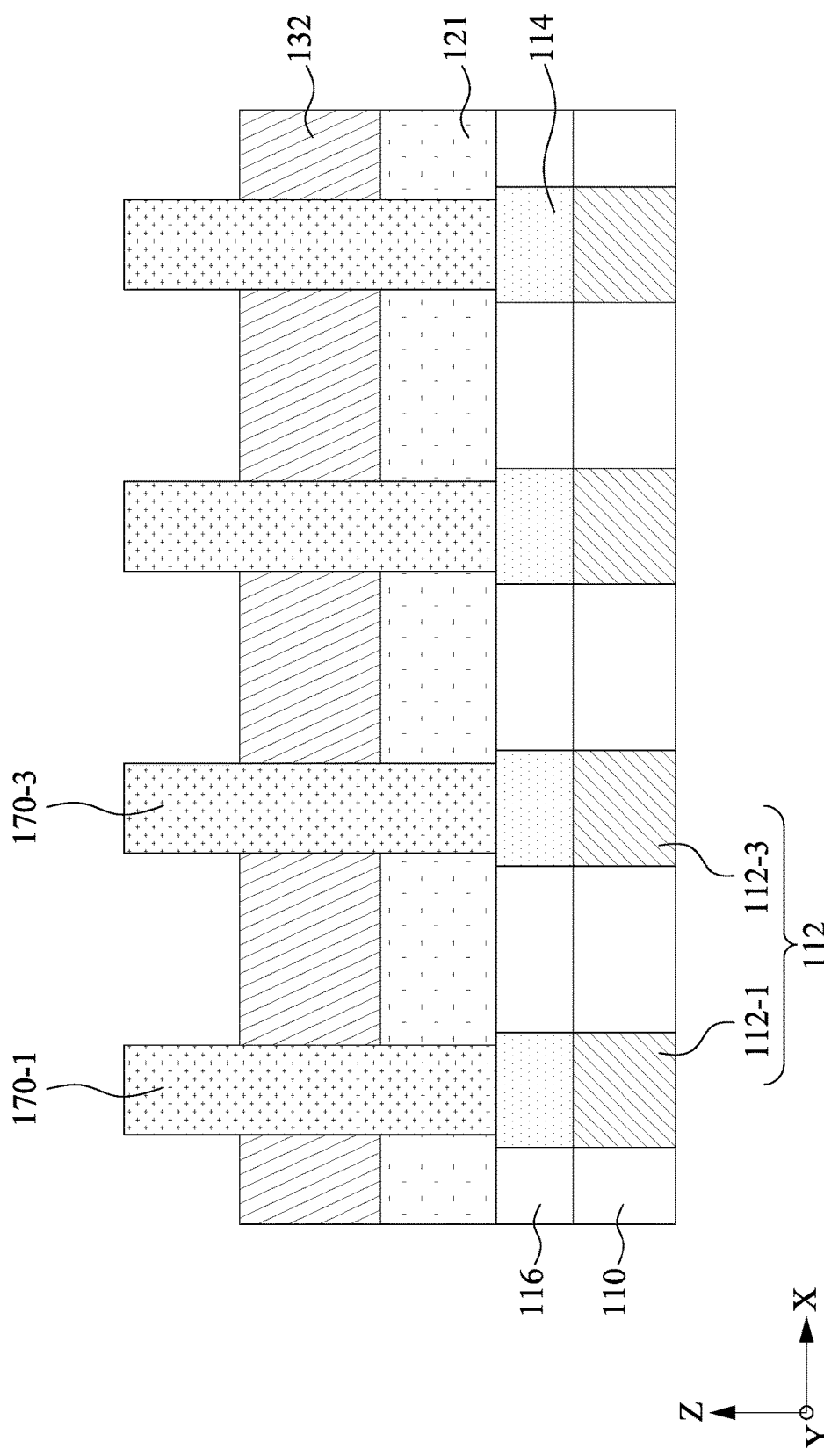
FIG. 8B is a cross-section along line A-A' of FIG. 8A, in accordance with some embodiments of the present disclosure.

Referring to FIG. 8A and FIG. 8B, a portion of the dielectric layer 122 may be removed. The mask pattern 180 may be removed. In some embodiments, the portion of the dielectric layer 122 exposed by the mask pattern 180 may be removed. The sidewall of the dielectric layer 122 may be exposed, as shown in FIG. 8A. For example, a sidewall 122s1 and a sidewall 122s2 of the dielectric layer 122 may be exposed.

Figure 9A:
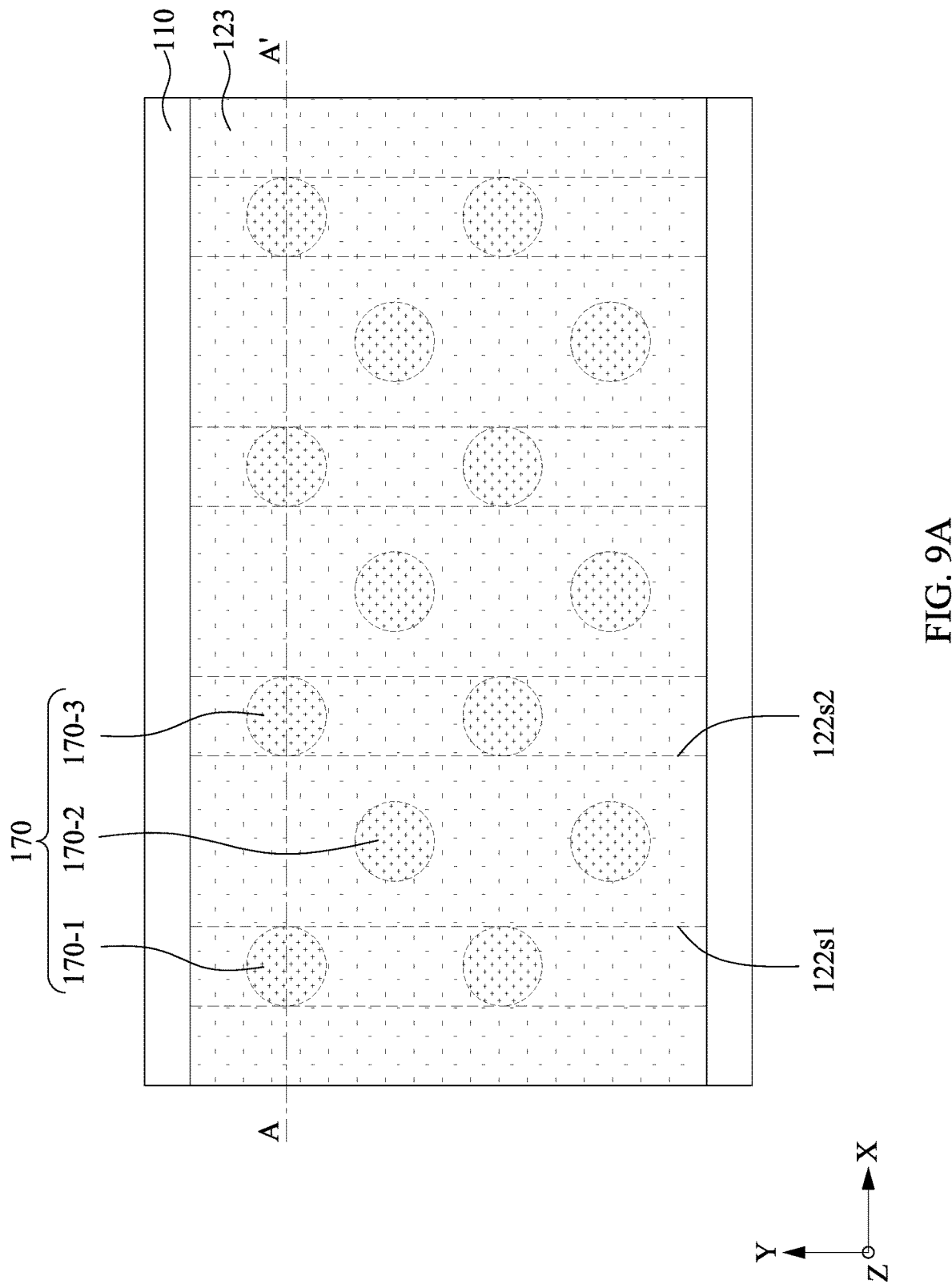
FIG. 9A illustrates one or more stages of an exemplary method for manufacturing a semiconductor device according to some embodiments of the present disclosure.
Figure 9B:
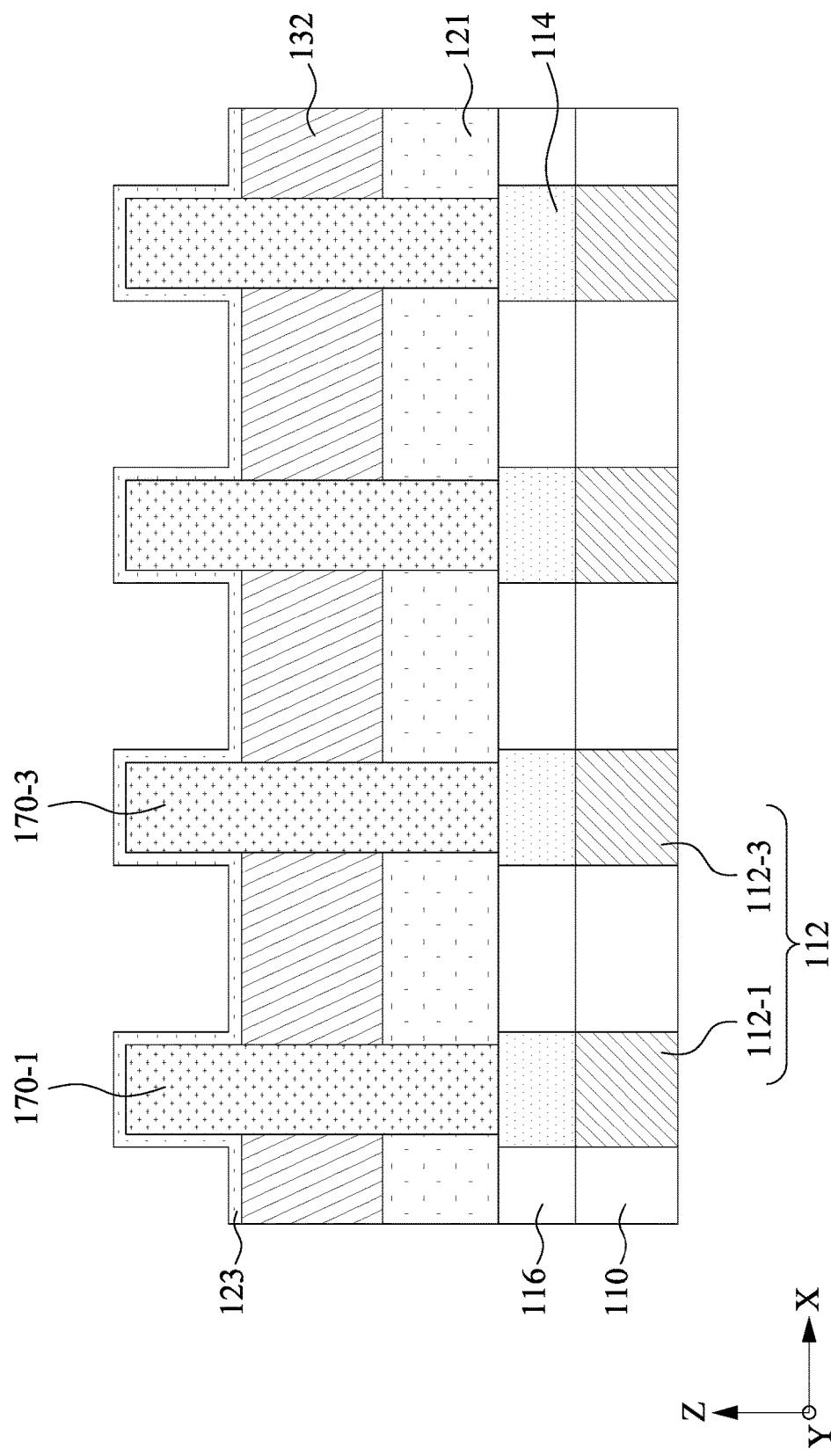
FIG. 9B is a cross-section along line A-A' of FIG. 9A, in accordance with some embodiments of the present disclosure.

Referring to FIG. 9A and FIG. 9B, a spacer-defining dielectric 123 may be formed. In some embodiments, the spacer-defining dielectric 123 may be conformally formed on the sacrificial layer 170 and the metallization layer 132. The spacer-defining dielectric 123 may cover the sidewalls 122s1 and 122s2 of the dielectric layer 122.

The spacer-defining dielectric 123 may include silicon oxide ($SiO_x$), silicon nitride ($Si_xN_y$), silicon oxynitride (SiON), or other suitable materials. The spacer-defining dielectric 123 may be formed by, for example, ALD, CVD, PVD, LPCVD, PECVD, or other suitable processes.

Figure 10A:
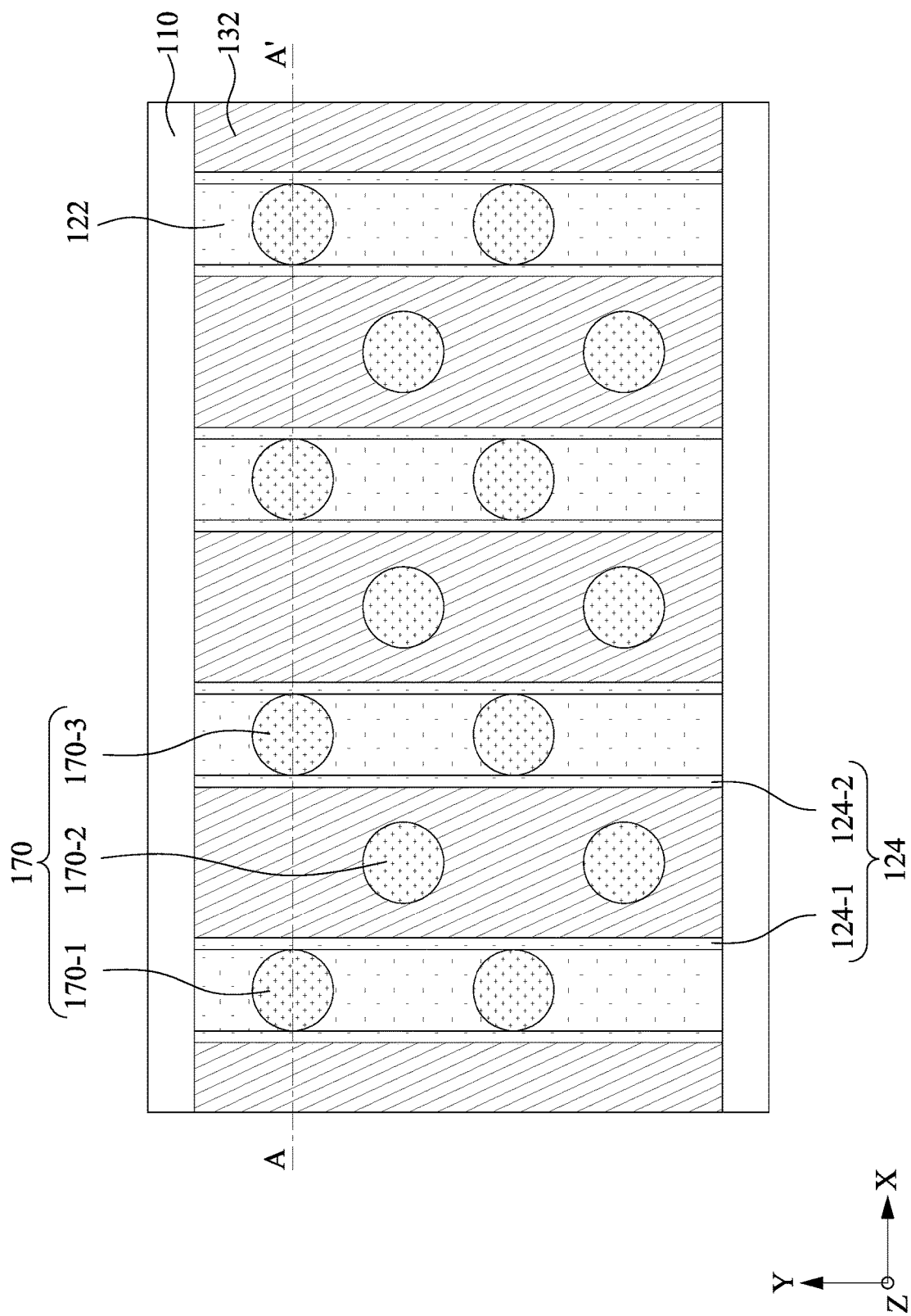
FIG. 10A illustrates one or more stages of an exemplary method for manufacturing a semiconductor device according to some embodiments of the present disclosure.
Figure 10B:
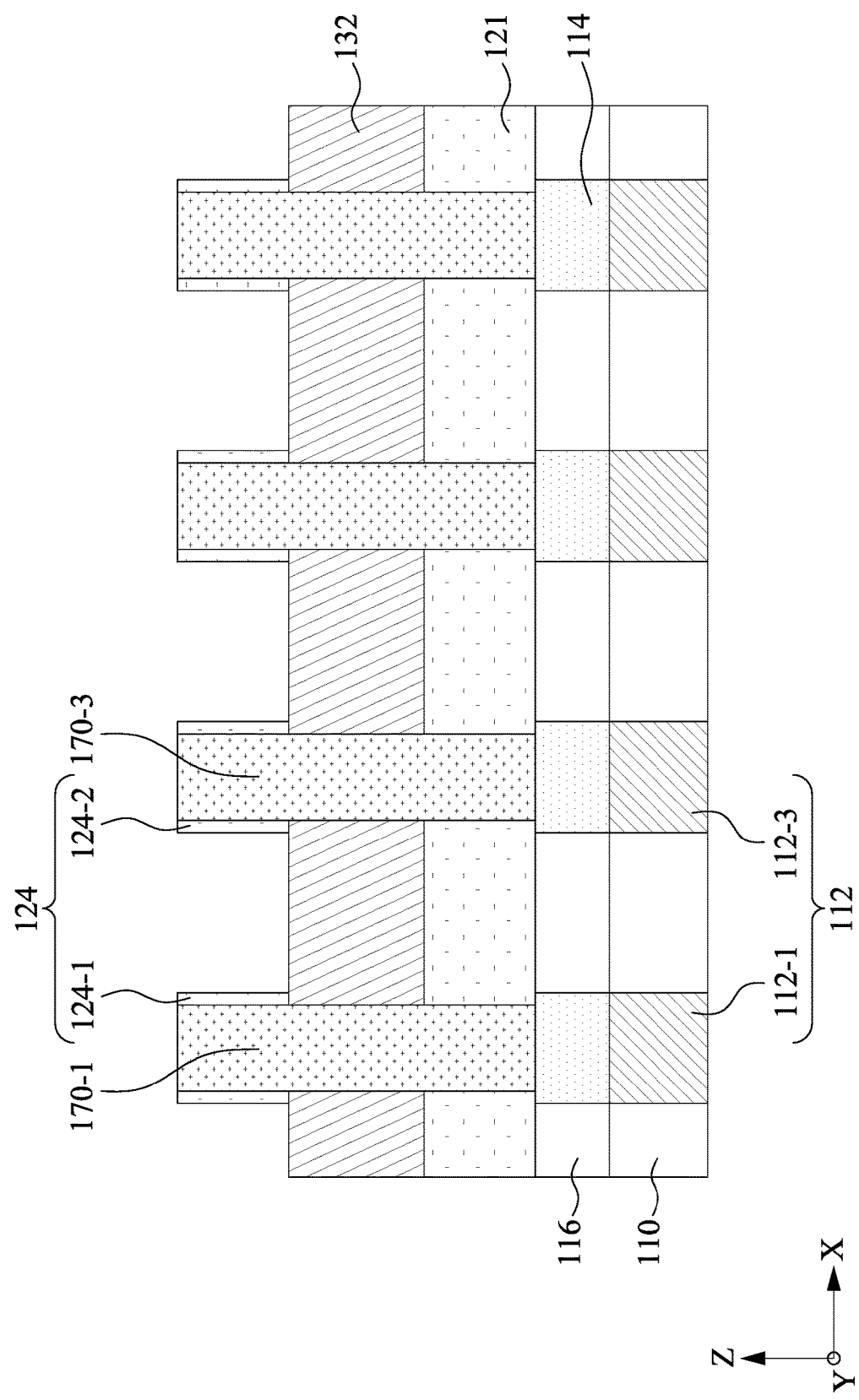
FIG. 10B is a cross-section along line A-A' of FIG. 10A, in accordance with some embodiments of the present disclosure.

Referring to FIG. 10A and FIG. 10B, spacers 124 (e.g., 124-1 and 124-2) may be formed. In some embodiments, a portion of the spacer-defining dielectric 123 may be removed to form the spacers 124. In some embodiments, the spacer-defining dielectric 123 over the upper surface of the sacrificial layer 170 and over the metallization layer 132 may be removed. In some embodiments, the spacer 124 may be formed on a sidewall of the dielectric layer 122. For example, the spacer 124-1 may be formed on the sidewall 122s1 of the dielectric structure 120. The spacer 124-2 may be formed on the sidewall 122s2 of the dielectric structure 120. The spacer 124-1 may face the spacer 124-2. In some embodiments, the spacer 124 may be formed on the sidewall of the sacrificial layer 170. In some embodiments, the spacer 124 may extend along the Y-axis.

Figure 11A:
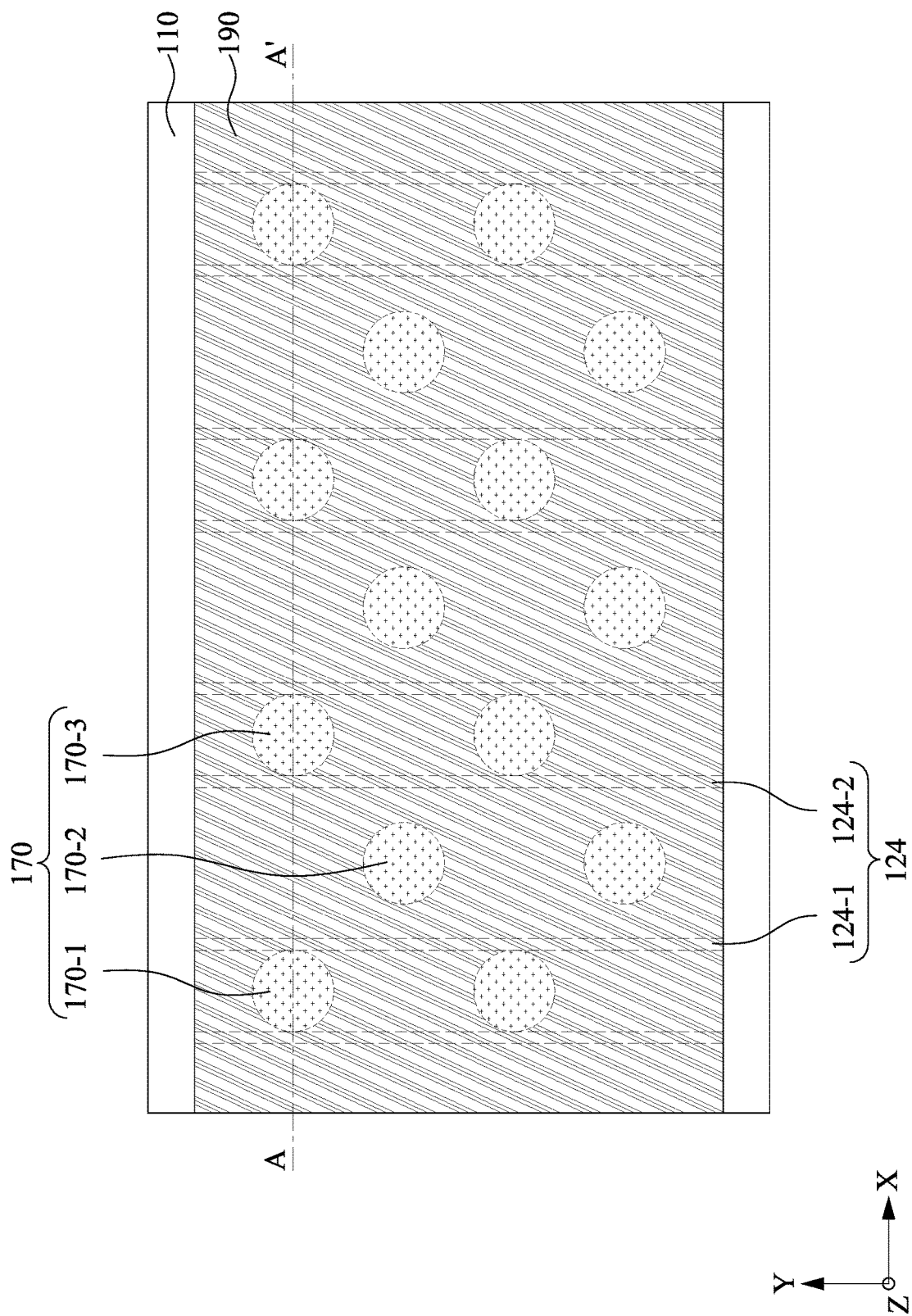
FIG. 11A illustrates one or more stages of an exemplary method for manufacturing a semiconductor device according to some embodiments of the present disclosure.
Figure 11B:
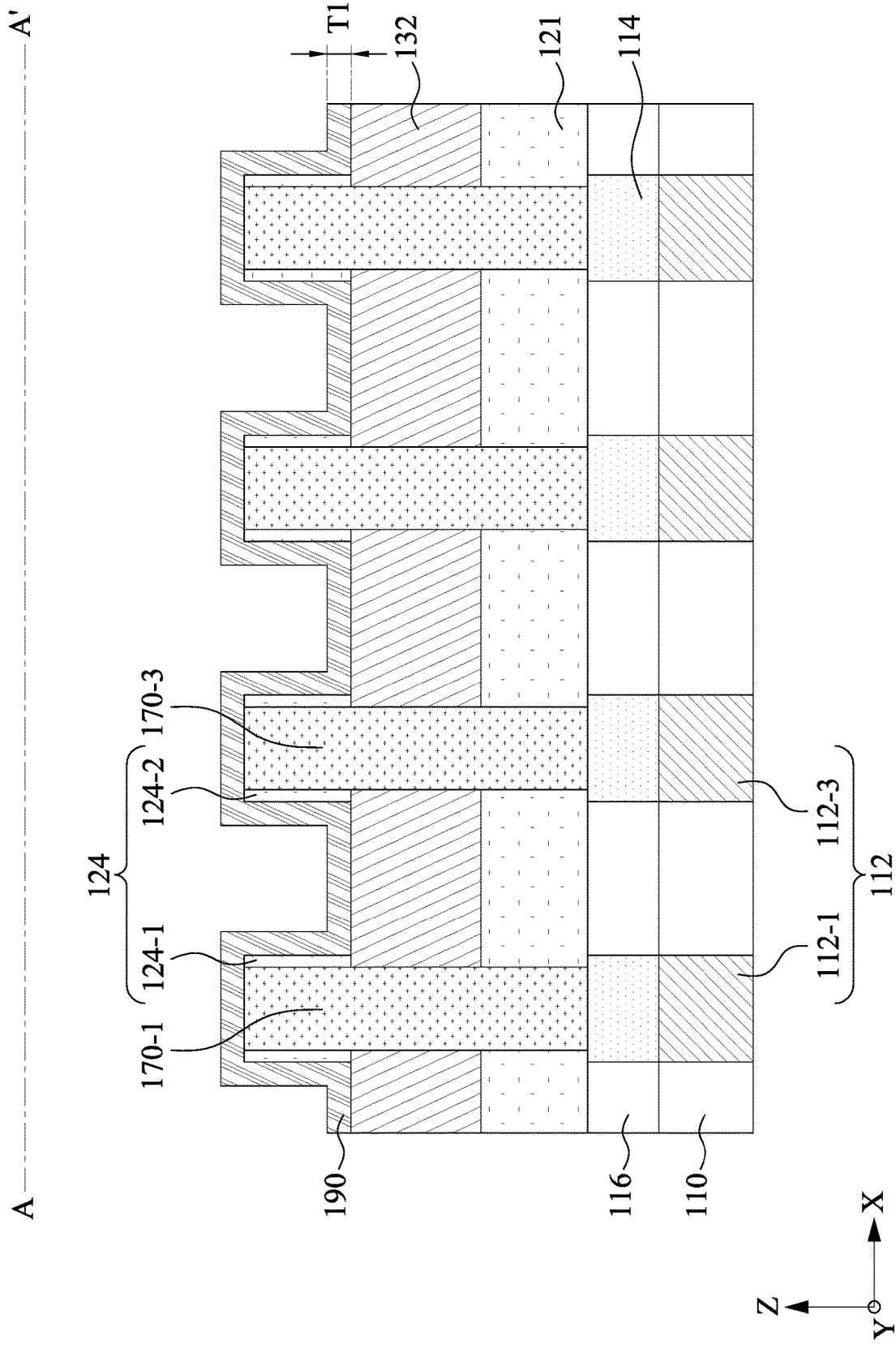
FIG. 11B is a cross-section along line A-A' of FIG. 11A, in accordance with some embodiments of the present disclosure.

Referring to FIG. 11A and FIG. 11B, a width controlling layer 190 may be formed. In some embodiments, the width controlling layer 190 may be conformally formed on the sacrificial layer 170, the spacer 124, and the metallization layer 132. The width controlling layer 190 may be conformally formed on the dielectric layer 122, as shown in

FIG. 11A.

In some embodiments, the material of the width controlling layer 190 may be different from the spacer 124. In some embodiments, the width controlling layer 190 may include silicon nitride ($Si_xN_y$), silicon oxynitride (SiON), or other suitable materials. The width controlling layer 190 may be formed by, for example, ALD, CVD, PVD, LPCVD, PECVD, or other suitable processes.

The width controlling layer 190 may have a thickness T1. In some embodiments, the thickness T1 of the width controlling layer 190 may be utilized to determine a width of a word line, which will be formed subsequently.

Figure 12A:
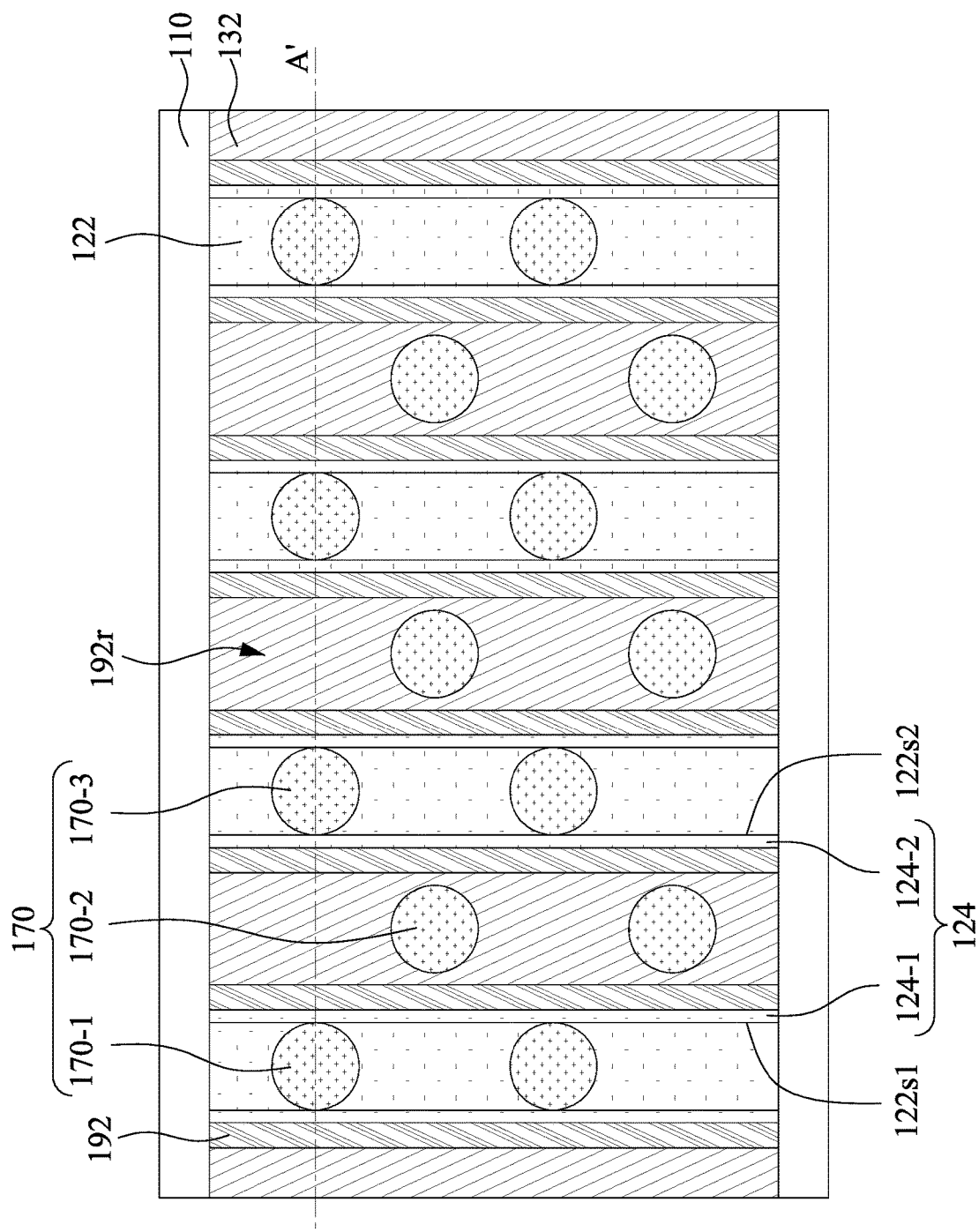
FIG. 12A illustrates one or more stages of an exemplary method for manufacturing a semiconductor device according to some embodiments of the present disclosure.
Figure 12B:
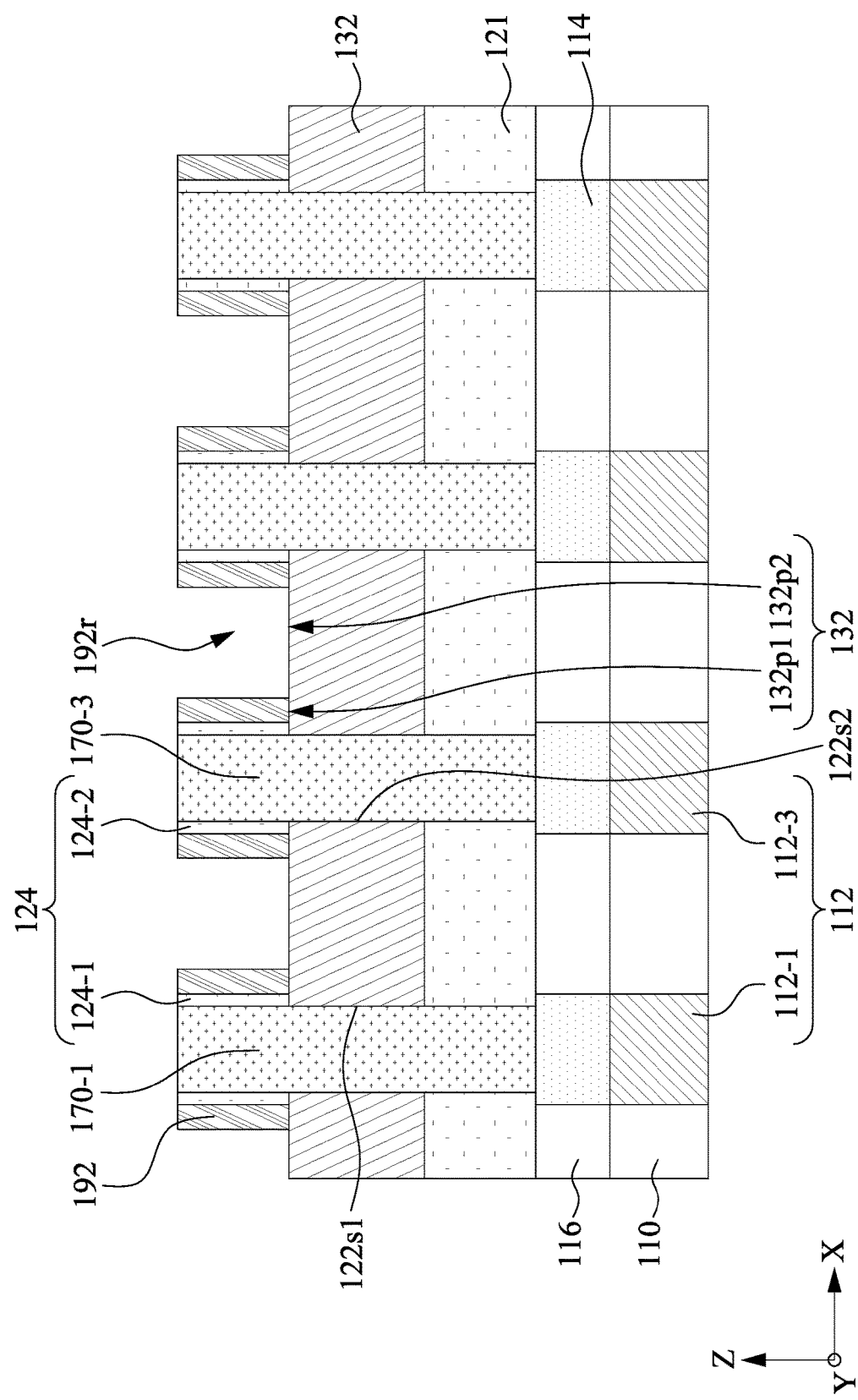
FIG. 12B is a cross-section along line A-A' of FIG. 12A, in accordance with some embodiments of the present disclosure.

Referring to FIG. 12A and FIG. 12B, a width controlling structure 192 may be formed. In some embodiments, the portions of the width controlling layer 190 over the upper surface of the sacrificial layer 170, the dielectric layer 122, the spacer 124, and metallization layer 132 are removed. In some embodiments, the width controlling structure 192 may be formed on the sidewall 122s1 of the dielectric layer 122. In some embodiments, the width controlling structure 192 may be formed on the sidewall 122s2 of the dielectric layer 122. In some embodiments, the width controlling structure 192 may be formed on the sidewall (not annotated in the figures) of the spacer 124. In some embodiments, the thickness, which may be substantially equal to the thickness T1, of the width controlling structure 192 may be utilized to determine a width of a word line, which will be formed subsequently. In some embodiments, the width controlling structure 192 may define a recess 192r exposing the metallization layer 132. In some embodiments, the width controlling structure 192 may cover a portion 132p1 of the metallization layer 132. In some embodiments, a portion 132p2 of the metallization layer 132 may be exposed by the width controlling structure 192.

Figure 13A:
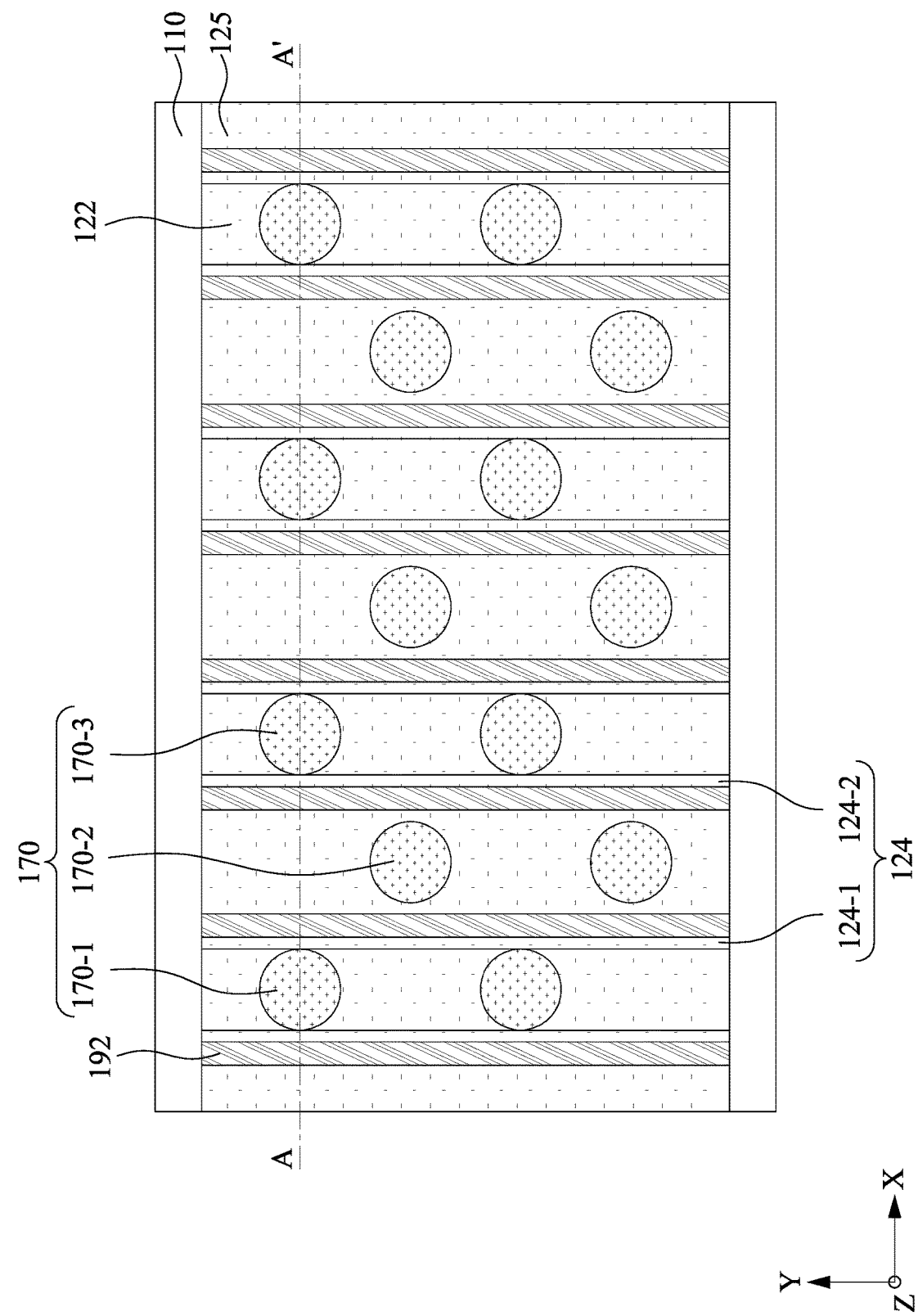
FIG. 13A illustrates one or more stages of an exemplary method for manufacturing a semiconductor device according to some embodiments of the present disclosure.
Figure 13B:
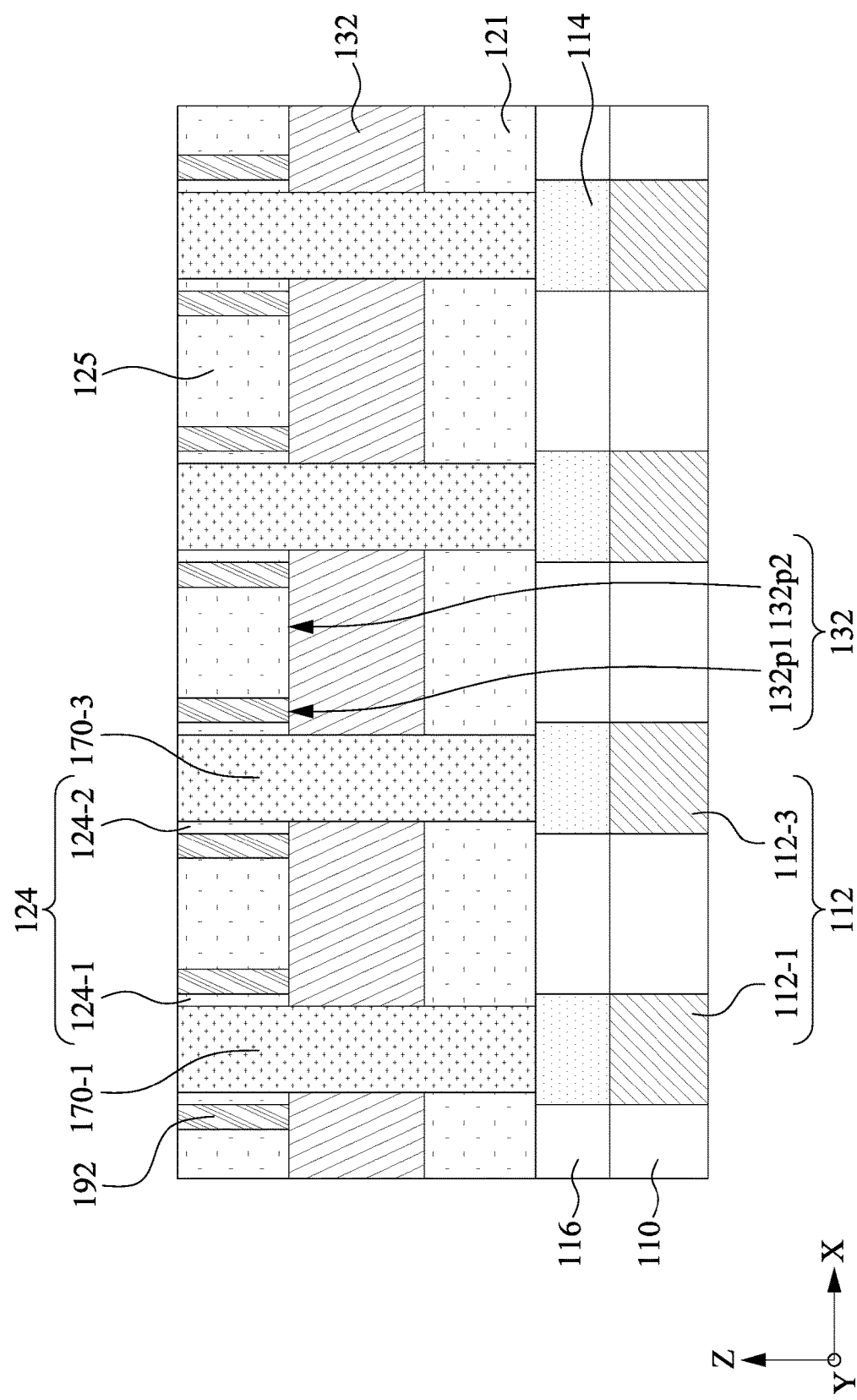
FIG. 13B is a cross-section along line A-A' of FIG. 13A, in is accordance with some embodiments of the present disclosure.

Referring to FIG. 13A and FIG. 13B, a filling layer 125 may be formed. In some embodiments, the filling layer 125 may be formed within the recess 192r. In some embodiments, the filling layer 125 may cover the portion 132p2 of the metallization layer 132. In some embodiments, the filling layer 125 may include silicon oxide ($SiO_x$), silicon nitride ($Si_xN_y$), silicon oxynitride (SiON), or other suitable materials. The filling layer 125 may be formed by, for example, CVD, ALD, PVD, LPCVD, PECVD, or other suitable processes.

Figure 14A:
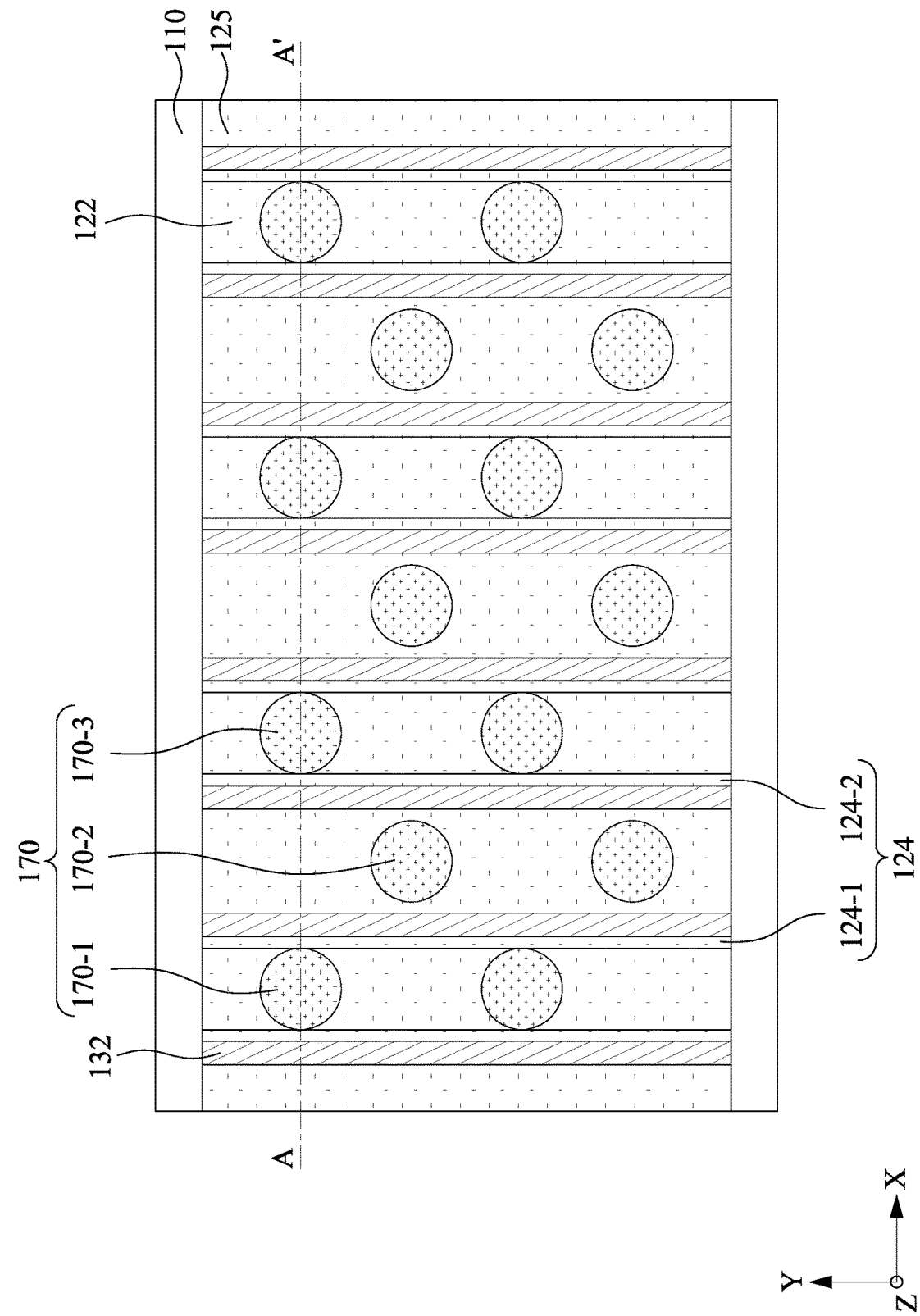
FIG. 14A illustrates one or more stages of an exemplary method for manufacturing a semiconductor device according to some embodiments of the present disclosure.
Figure 14B:
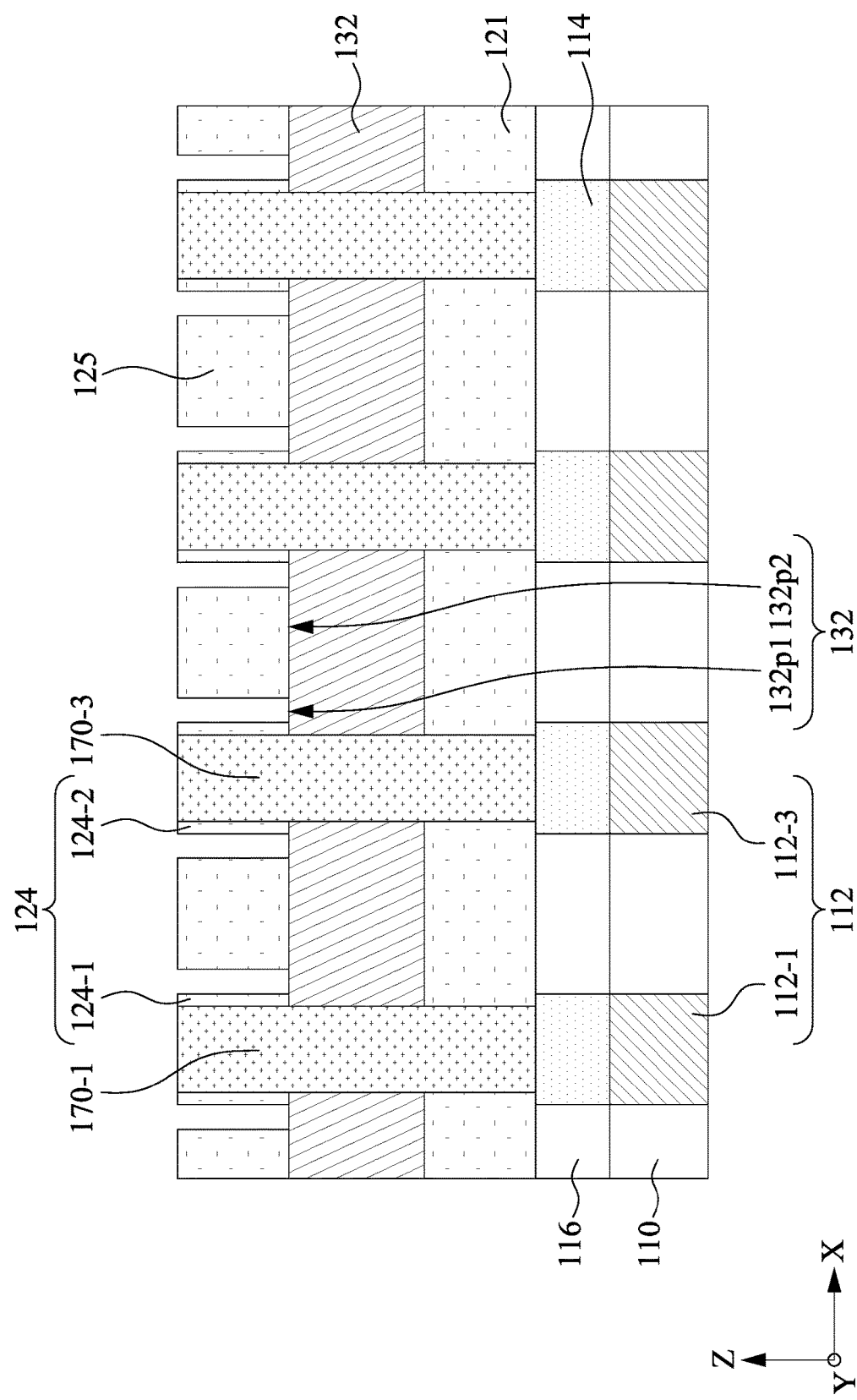
FIG. 14B is a cross-section along line A-A' of FIG. 14A, in accordance with some embodiments of the present disclosure.

Referring to FIG. 14A and FIG. 14B, the width controlling structure 192 may be removed. In some embodiments, the portion 132p1 of the metallization layer 132 may be exposed by the sacrificial layer 170, dielectric layer 122, the spacer 124, and the filling layer 125. The portion 132p2 is covered by the filling layer 125.

Figure 15A:
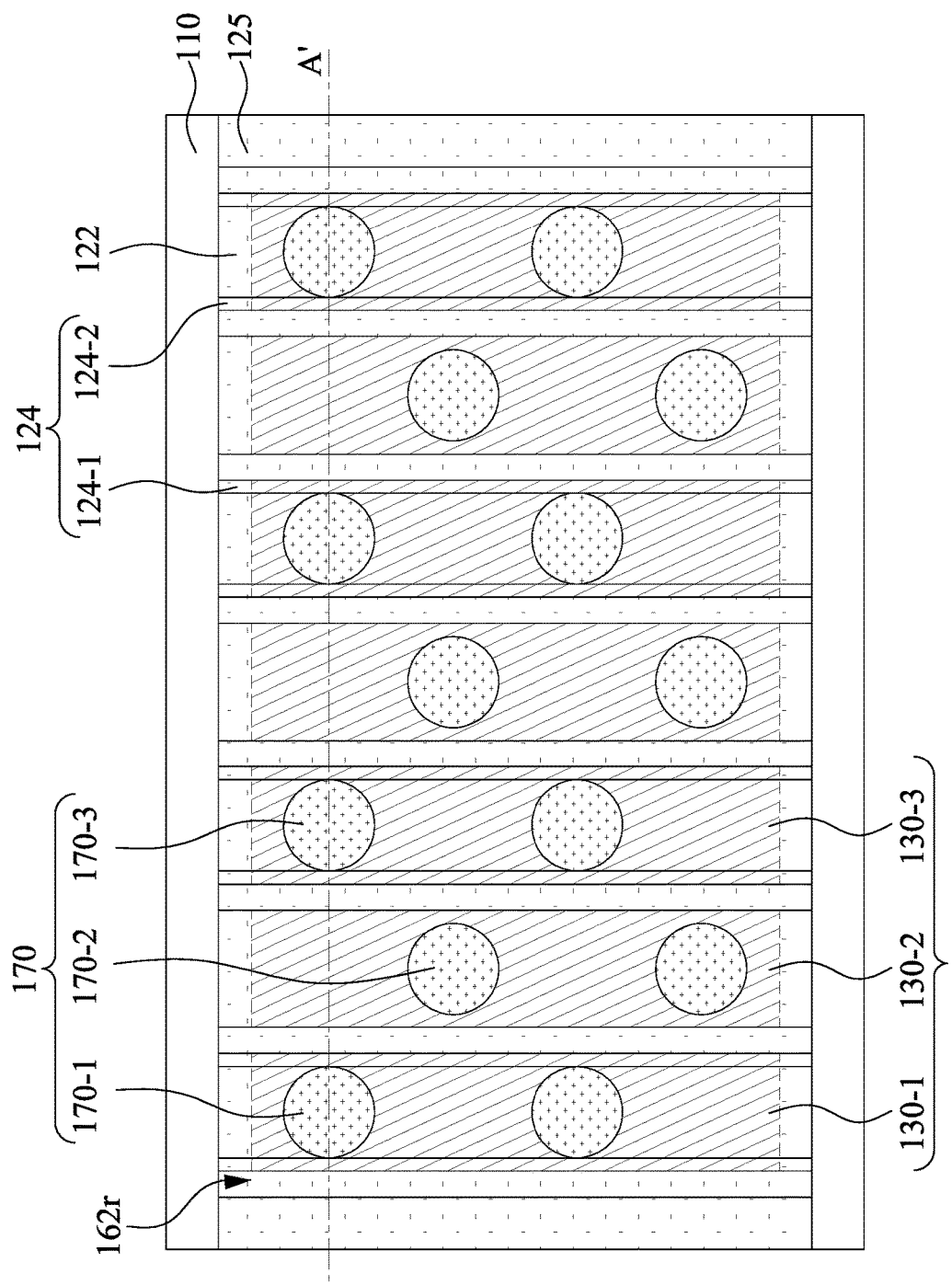
FIG. 15A illustrates one or more stages of an exemplary method for manufacturing a semiconductor device according to some embodiments of the present disclosure.
Figure 15B:
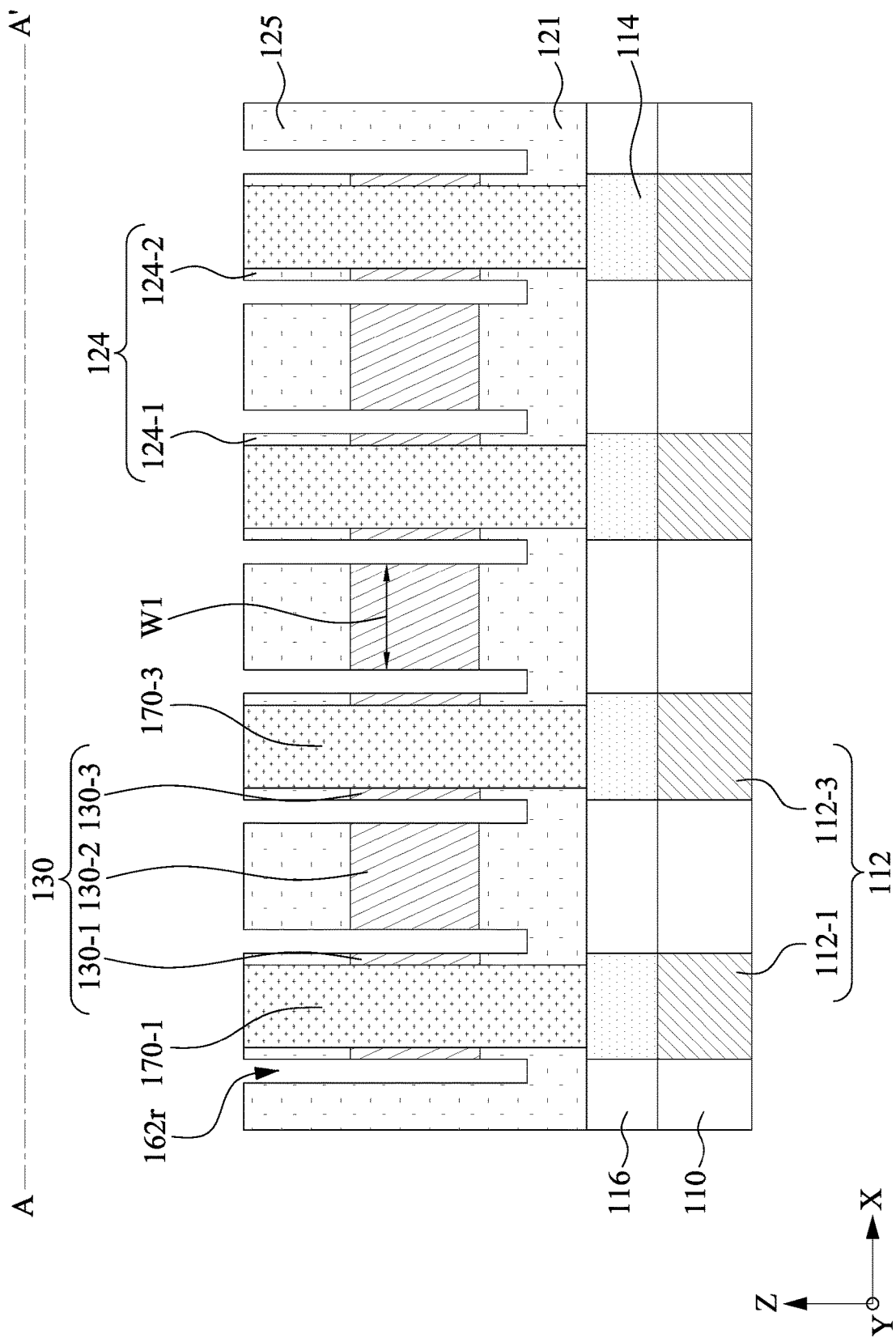
FIG. 15B is a cross-section along line A-A' of FIG. 15A, in accordance with some embodiments of the present disclosure.

Referring to FIG. 15A and FIG. 15B, word lines 130 (e.g., 130-1, 130-2, and 130-3) may be formed. In some embodiments, the portion 132p1 of the metallization layer 132 may be removed. In some embodiments, the portion 132p2 of the metallization layer 132 may be utilized to define the word line 130. In some embodiments, a width W1 of the word line 130 may be determined by the thickness of the width controlling structure 192. In some embodiments, a portion of the dielectric layer 121 may be removed. A recess 162r may be formed. In some embodiments, the recess 162r may be located between the word lines 130.

Figure 16A:
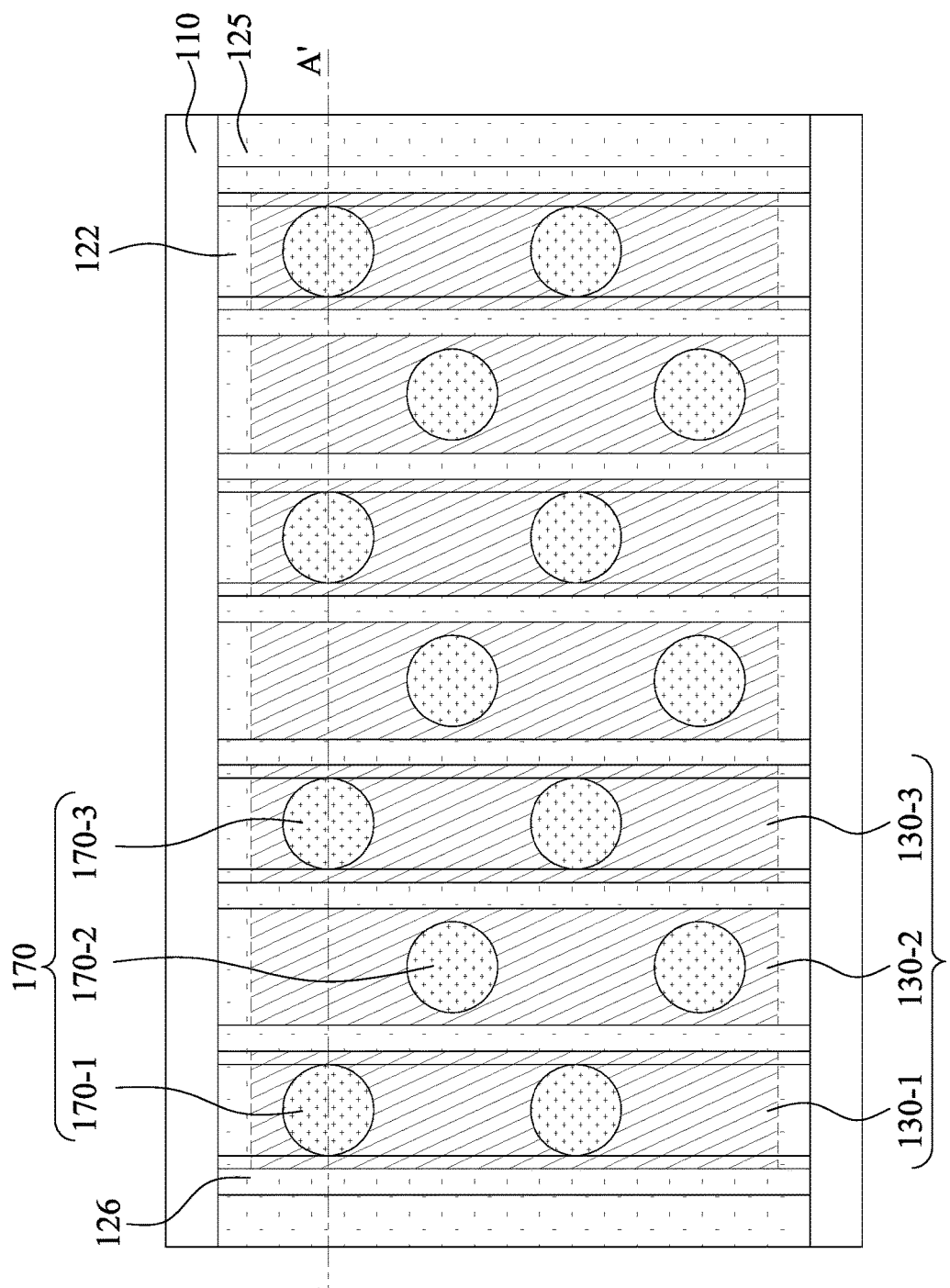
FIG. 16A illustrates one or more stages of an exemplary method for manufacturing a semiconductor device according to some embodiments of the present disclosure.
Figure 16B:
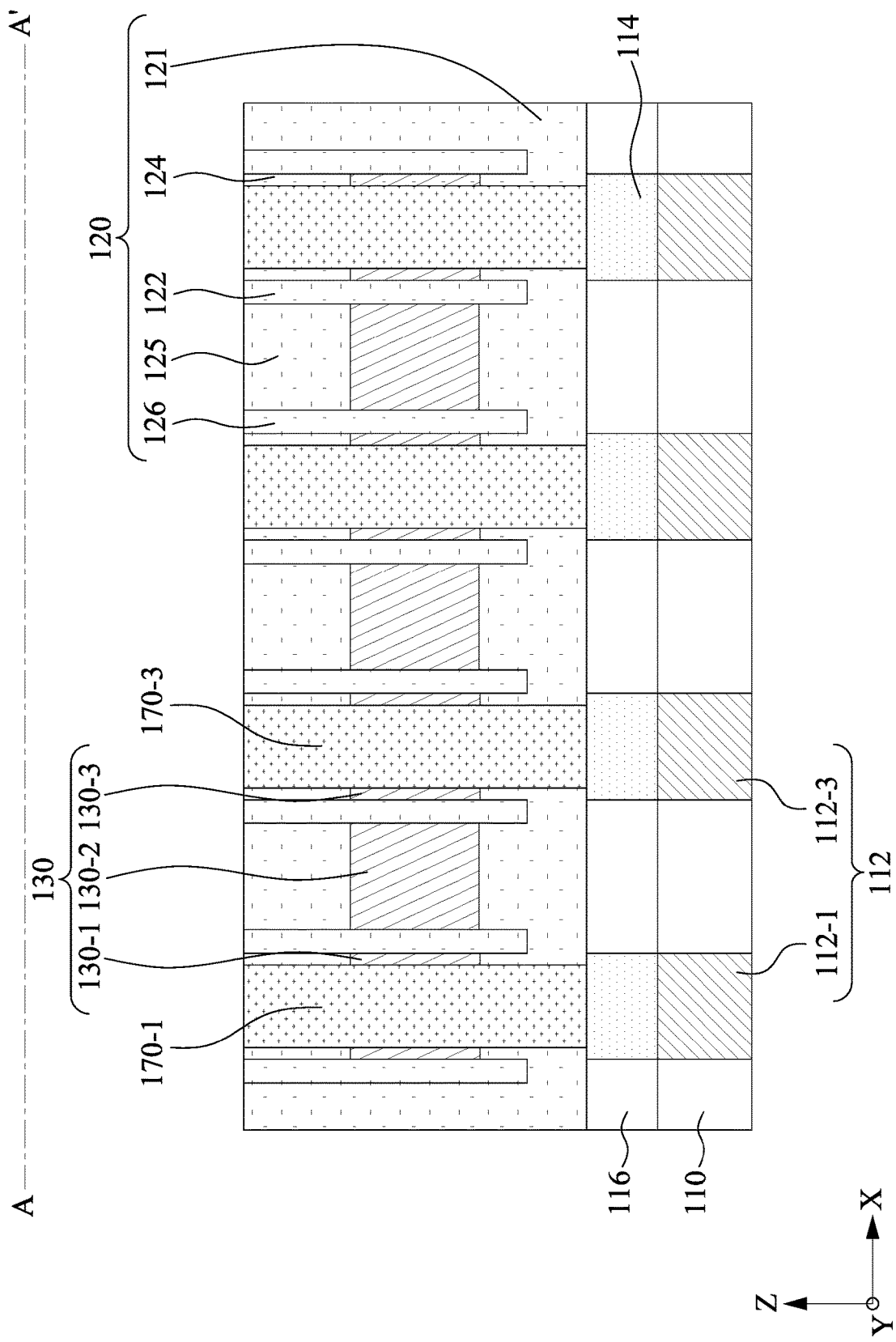
FIG. 16B is a cross-section along line A-A' of FIG. 16A, in accordance with some embodiments of the present disclosure.

Referring to FIG. 16A and FIG. 16B, an isolation layer 126 may be formed. In some embodiments, the isolation layer 126 may be formed within the recess 162r, thereby produces a dielectric structure 120.

Figure 17A:
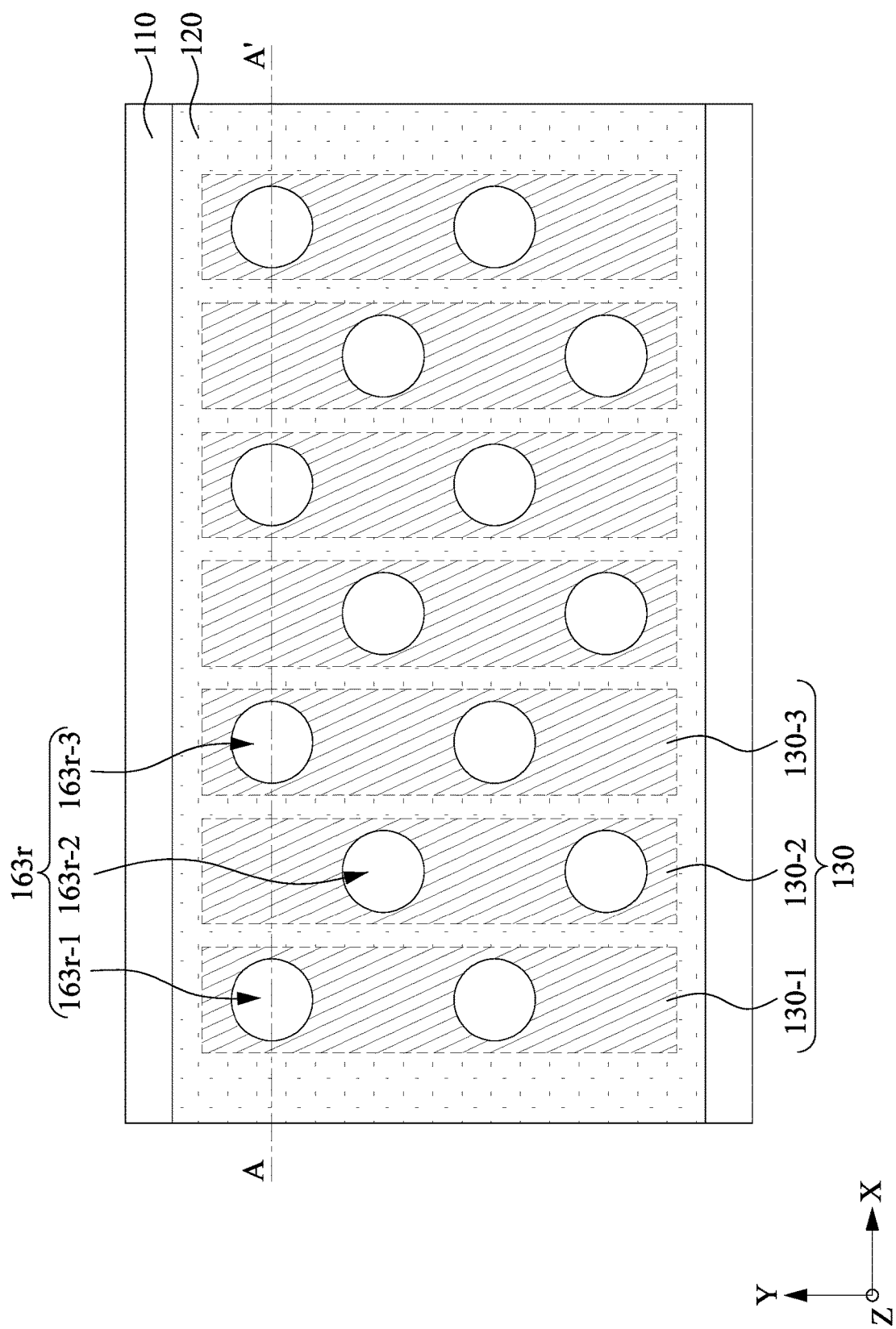
FIG. 17A illustrates one or more stages of an exemplary method for manufacturing a semiconductor device according to some embodiments of the present disclosure.
Figure 17B:
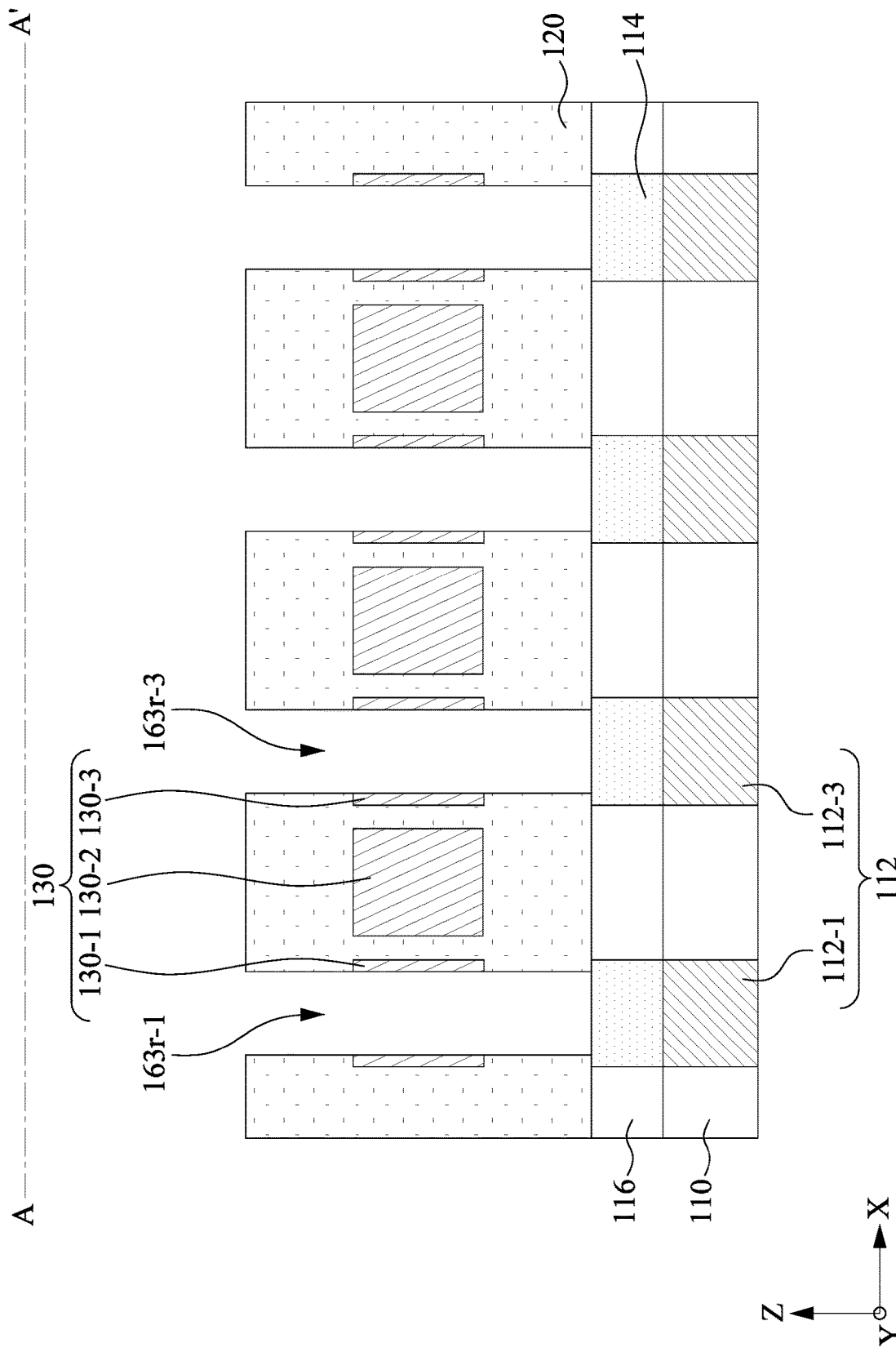
FIG. 17B is a cross-section along line A-A' of FIG. 17A, in accordance with some embodiments of the present disclosure.

Referring to FIG. 17A and FIG. 17B, a hole 163r (e.g., 163r-1, 163r-2, and 163r-3) may be formed. In some embodiments, the sacrificial layer 170 may be removed to form recesses 163r. In some embodiments, the hole 163r may penetrate the dielectric structure 120 and the word line 130. The hole 163r-1 may be aligned with the hole 163r-3 along the X-axis. The hole 163r-1 may be misaligned with the hole 163r-2 along the X-axis.

Figure 18A:
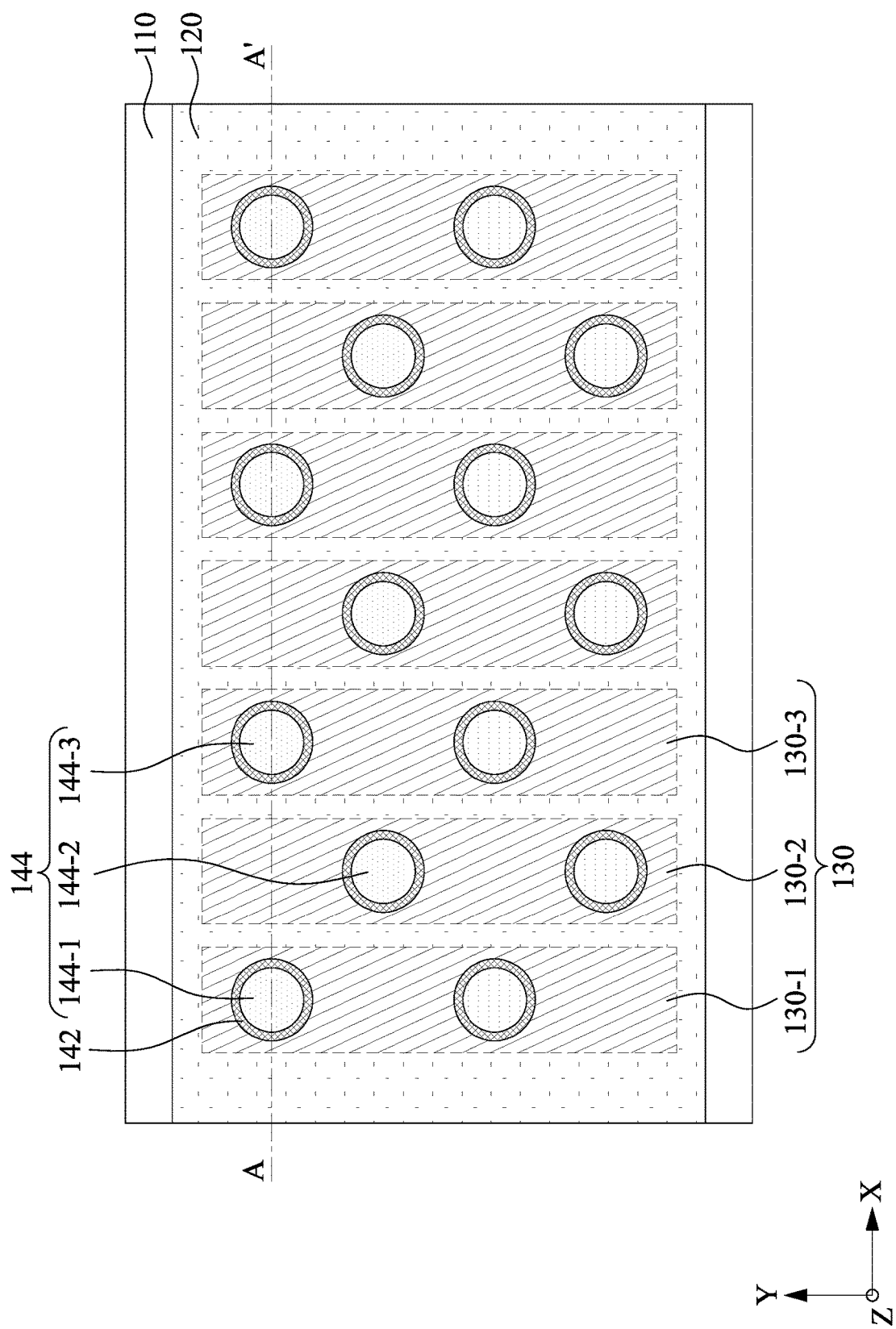
FIG. 18A illustrates one or more stages of an exemplary method for manufacturing a semiconductor device according to some embodiments of the present disclosure.
Figure 18B:
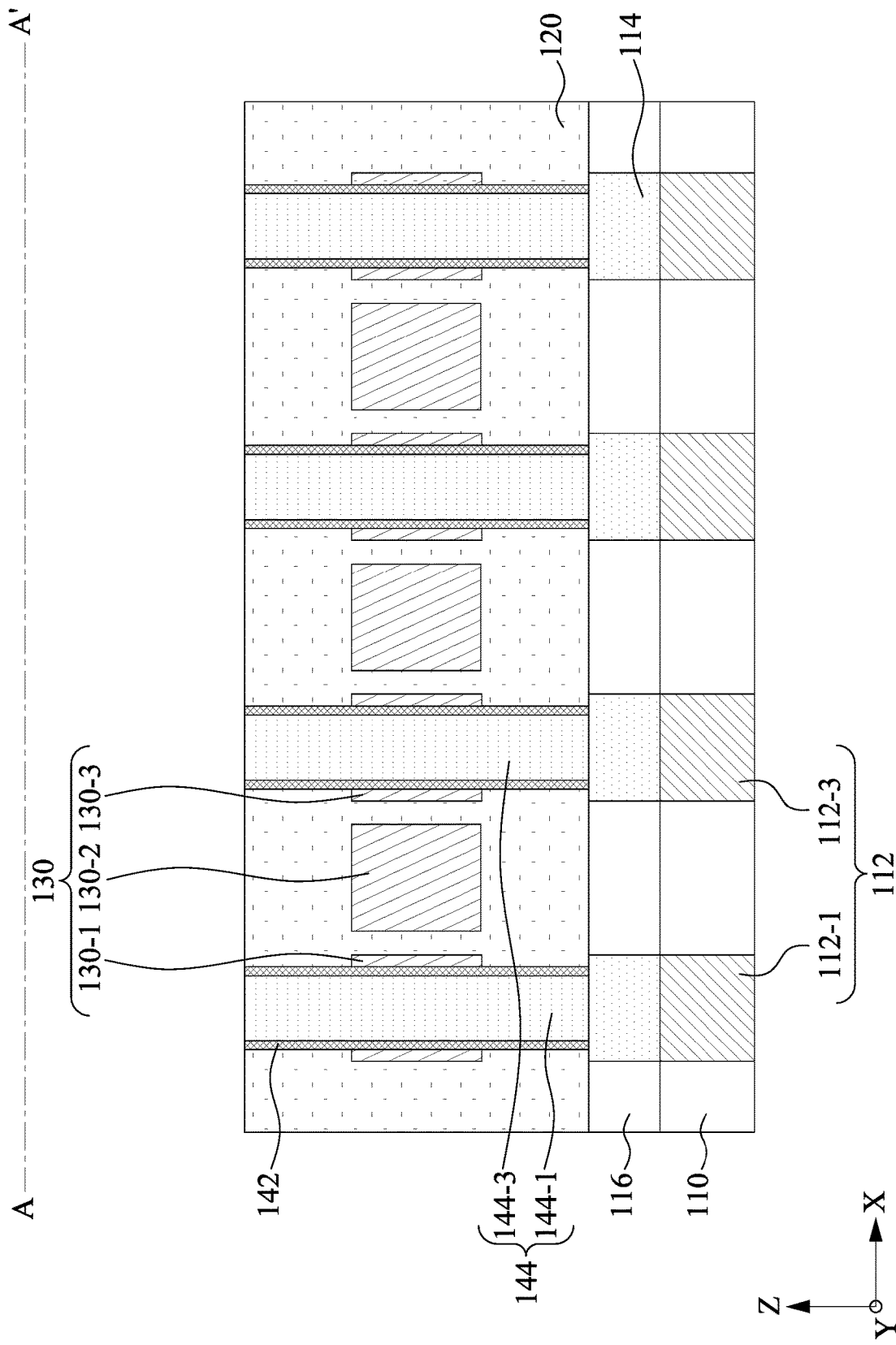
FIG. 18B is a cross-section along line A-A' of FIG. 18A, in accordance with some embodiments of the present disclosure.

Referring to FIG. 18A and FIG. 18B, gate dielectric layers 142 and channel layers 144 (e.g., 144-1, 144-2, and 144-3) may be formed. In some embodiments, the gate dielectric layer 142 may be formed within the recesses 163r-1, 163r-2, and 163r-3. In some embodiments, the channel layer 144-1 may be formed within the hole 163r-1. In some embodiments, the channel layer 144-2 may be formed within the hole 163r-2. In some embodiments, the channel layer 144-3 may be formed within the hole 163r-3.

Figure 19A:
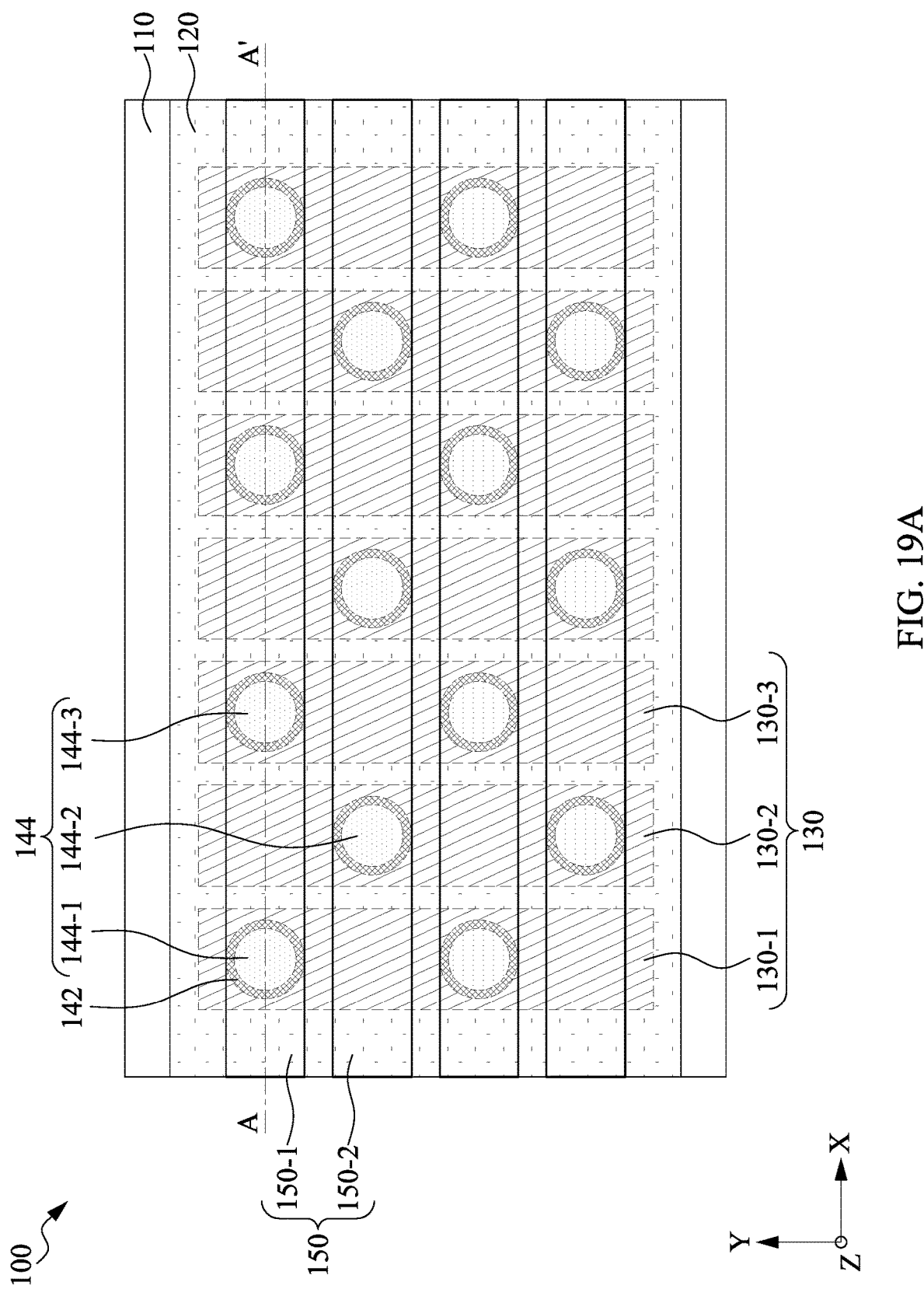
FIG. 19A illustrates one or more stages of an exemplary method for manufacturing a semiconductor device according to some embodiments of the present disclosure.
Figure 19B:
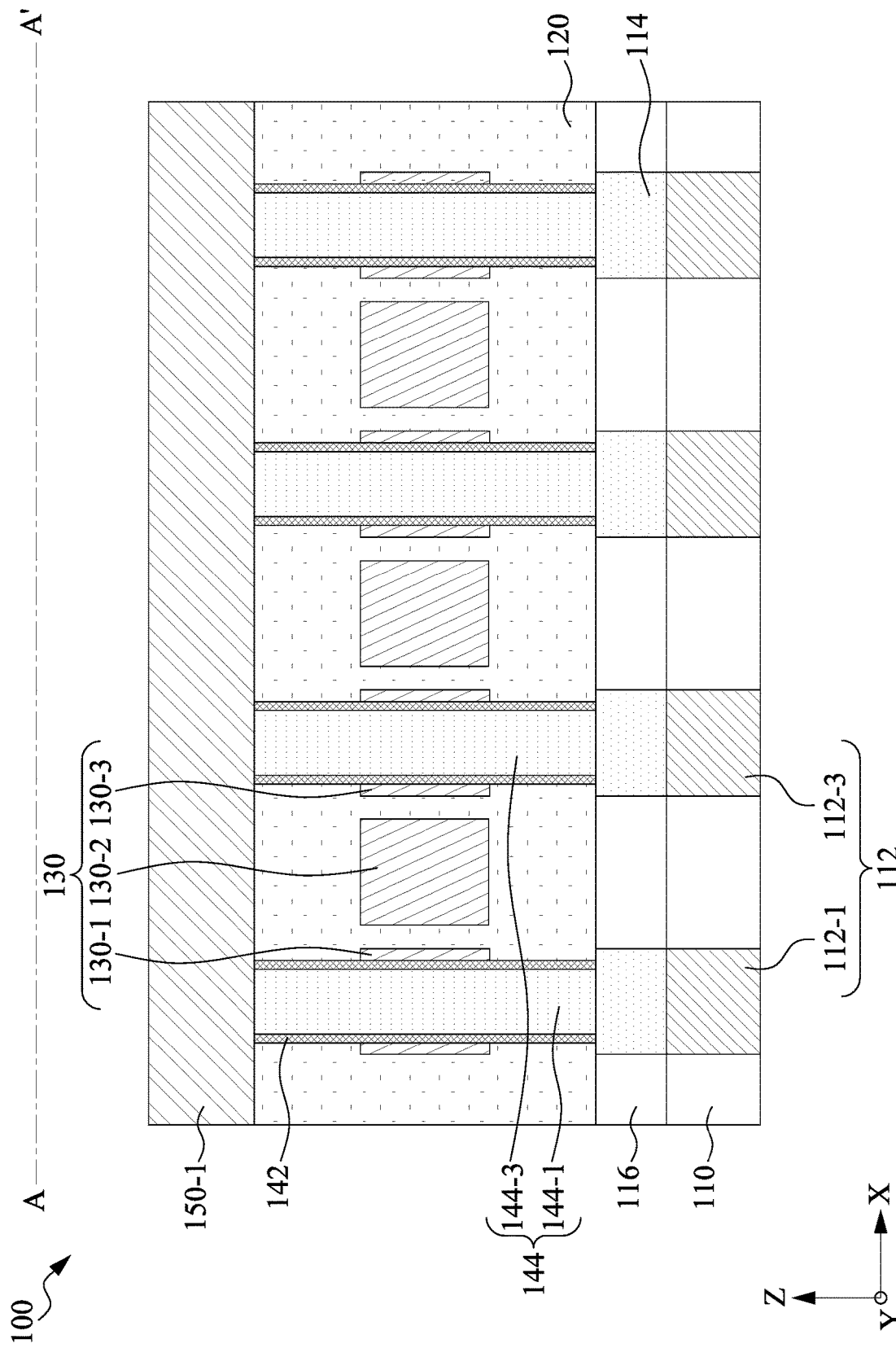
FIG. 19B is a cross-section along line A-A' of FIG. 19A, in accordance with some embodiments of the present disclosure.

Referring to FIG. 19A and FIG. 19B, bit lines 150 (e.g., 150-1 and 150-2) may be formed. In some embodiments, the bit line 150-1 may cover the channel layers 144-1 and 144-3. In some embodiments, the bit line 150-2 may cover the channel layer 144-2.

In this embodiment, the pattern of the word line 130 may be determined by the width controlling structure 192. The word line 130 may be formed without using a photolithography process, which may cause overlay error and then result in electrical leakage between the channel layer 144 and the word line 130. Further, the width of the word line 130 may be controlled accurately by determining the thickness of the width controlling structure 192. Thus, the performance of the semiconductor device 100 may be improved.

One aspect of the present disclosure provides a method of manufacturing a semiconductor device. The method includes providing a substrate comprising a first capacitor structure and a second capacitor structure therein, forming a metallization layer on the substrate, forming an upper dielectric layer over the metallization layer, forming a first sacrificial layer and a second sacrificial layer, each of which penetrates the upper dielectric layer and the metallization layer, wherein the first sacrificial layer vertically overlaps the first capacitor structure and the second sacrificial layer vertically overlaps the second capacitor structure, removing the upper dielectric layer, forming a width controlling structure between the first sacrificial layer and the second sacrificial layer, wherein the width controlling structure defines a recess exposing the metallization layer, forming a protective layer within the recess of the width controlling structure, removing the width controlling structure to expose a portion of the metallization layer, and patterning the metallization layer to form a word line between the first sacrificial layer and the second sacrificial layer.

Another aspect of the present disclosure provides a method of manufacturing a semiconductor device. The method includes providing a substrate, forming a metallization layer on the substrate, forming an upper dielectric layer over the metallization layer, forming a first sacrificial layer, a second sacrificial layer, and a third sacrificial layer penetrating the upper dielectric layer and the metallization layer, wherein the first sacrificial layer is aligned with the third sacrificial layer along a first axis, and the second sacrificial layer is free from overlapping the first sacrificial layer and the third sacrificial layer along the first axis, forming a width controlling structure between the first sacrificial layer and the third sacrificial layer, wherein the width controlling structure defines a recess exposing the upper dielectric layer, forming a protective layer within the recess, removing the width controlling structure to expose a portion of the metallization layer, patterning the metallization layer to form a first word line surrounding the first sacrificial layer, a second word line surrounding the second sacrificial layer, and a third word line surrounding the third sacrificial layer.

Another aspect of the present disclosure provides a method for manufacturing a semiconductor device. The method includes providing a substrate, forming a metallization layer on the substrate, forming an upper dielectric layer over the metallization layer, forming a first sacrificial layer and a second sacrificial layer penetrating the upper dielectric layer and the metallization layer, removing a portion of the upper dielectric layer between the first sacrificial layer and the second sacrificial layer to expose the metallization layer, forming a width controlling structure to cover a first portion of the metallization layer and expose a second portion of the metallization, and patterning the metallization layer to form a first word line surrounding the first sacrificial layer and a second word line surrounding the second sacrificial layer.

The embodiments of the present disclosure provide a method of manufacturing a semiconductor device. In this embodiment, the pattern of the word line may be determined by a width controlling structure. The word line may be formed without using a photolithography process, which may cause overlay error and then result in electrical leakage between a channel layer and a word line. Further, the width of the word line may be controlled accurately by determining the thickness of the width controlling structure. Thus, the performance of the semiconductor device may be improved.

Although the present disclosure and its advantages have been described in detail, it should be understood that various changes, substitutions and alterations may be made herein without departing from the spirit and scope of the disclosure as defined by the appended claims. For example, many of the processes discussed above may be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, or steps.

What is claimed is:

1. A method of manufacturing a semiconductor device, comprising:
    providing a substrate comprising a first capacitor structure and a second capacitor structure therein;
    forming a metallization layer on the substrate;
    forming an upper dielectric layer over the metallization layer;
    forming a first sacrificial layer and a second sacrificial layer, each of which penetrates the upper dielectric layer and the metallization layer, wherein the first sacrificial layer vertically overlaps the first capacitor structure and the second sacrificial layer vertically overlaps the second capacitor structure;
    removing the upper dielectric layer;
    forming a width controlling structure between the first sacrificial layer and the second sacrificial layer, wherein the width controlling structure defines a recess exposing the metallization layer;
    forming a protective layer within the recess of the width controlling structure;
    removing the width controlling structure to expose a portion of the metallization layer; and
    patterning the metallization layer to form a word line between the first sacrificial layer and the second sacrificial layer.

2. The method of claim 1, further comprising:
    forming a first spacer on the first sacrificial layer and a second spacer on the second sacrificial layer, wherein the width controlling structure is between the first spacer and the second spacer.

3. The method of claim 2, wherein forming the width controlling structure comprises:
    forming a width controlling layer to cover the first sacrificial layer, the first spacer, the second sacrificial layer, the second spacer, and the metallization layer; and
    removing a portion of the width controlling layer to form the width controlling structure.

4. The method of claim 3, wherein the width controlling structure is free from vertically overlapping the first capacitor structure.

5. The method of claim 3, wherein the width controlling structure is spaced apart from the first sacrificial layer via the first spacer.

6. The method of claim 3, wherein a material of the first spacer is different from a material of the width controlling structure.

7. The method of claim 1, wherein the width controlling structure is configured to determine a width of the word line.

8. The method of claim 1, further comprising:
    removing the first sacrificial layer and the second sacrificial layer to form a first hole and a second hole; and
    forming a first channel layer within the first hole and a second channel layer within the second hole.

9. The method of claim 1, wherein patterning the metallization layer comprises:
    removing a portion of the metallization layer exposed by the first spacer, the second spacer, and the protective layer.

10. The method of claim 1, further comprising:
    forming a lower dielectric layer on the substrate, wherein the lower dielectric layer is disposed between the metallization layer and the substrate,
    wherein a portion of the lower dielectric layer exposed by the first spacer, the second spacer, and the protective layer is removed.

* * * * *